US011201588B2

(12) United States Patent
Haneda et al.

(10) Patent No.: US 11,201,588 B2
(45) Date of Patent: Dec. 14, 2021

(54) OSCILLATOR AND ELECTRONIC APPARATUS

(71) Applicant: Seiko Epson Corporation, Toyko (JP)

(72) Inventors: Hideo Haneda, Matsumoto (JP); Yasuhiro Sudo, Chino (JP); Akio Tsutsumi, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/124,868

(22) Filed: Dec. 17, 2020

(65) Prior Publication Data

US 2021/0194428 A1 Jun. 24, 2021

(30) Foreign Application Priority Data

Dec. 18, 2019 (JP) ............................ JP2019-228270
Dec. 18, 2019 (JP) ............................ JP2019-228271

(51) Int. Cl.

*H03B 5/36* (2006.01)
*G06F 1/08* (2006.01)
*G04F 10/00* (2006.01)
*H03B 5/04* (2006.01)
*G06F 1/04* (2006.01)

(52) U.S. Cl.

CPC ............ *H03B 5/36* (2013.01); *G04F 10/005* (2013.01); *G06F 1/04* (2013.01); *G06F 1/08* (2013.01); *H03B 5/04* (2013.01)

(58) Field of Classification Search

CPC H03B 5/36; H03B 5/04; G04F 10/005; G06F 1/08; G06F 1/04
USPC ......................... 331/16, 34, 1 A, 18, 11, 1 R
See application file for complete search history.

(56) References Cited

U.S. PATENT DOCUMENTS

| | | | | |
|---|---|---|---|---|
| 8,570,107 B2 * | 10/2013 | Guo | H03L 7/103 | 331/11 |
| 8,830,001 B2 * | 9/2014 | Zhuang | H03C 5/00 | 331/1 A |
| 2017/0117903 A1 | 4/2017 | Fukuzawa et al. | | |
| 2018/0062826 A1 | 3/2018 | Okuni et al. | | |

FOREIGN PATENT DOCUMENTS

| | | |
|---|---|---|
| JP | 2017-085535 A | 5/2017 |
| JP | 2018-037798 A | 3/2018 |

* cited by examiner

*Primary Examiner* — Arnold M Kinkead
(74) *Attorney, Agent, or Firm* — Harness, Dickey & Pierce, P.L.C.

(57) ABSTRACT

An oscillator includes a resonator, a clock signal generation circuit, a clock signal output terminal, an external signal input terminal, an interface circuit, and an interface terminal. The clock signal generation circuit oscillates the resonator to generate a clock signal. The clock signal output terminal outputs the clock signal. An external signal is input to the external signal input terminal. The interface circuit outputs time difference information obtained by measuring a time difference between a transition timing of a first signal based on the external signal input from the external signal input terminal and a transition timing of a second signal based on the clock signal, or frequency information obtained by measuring a frequency of a first clock signal, which is one of the clock signal and the external clock signal, based on a frequency of a second clock signal, which is the other of the clock signal and the external clock signal. The interface terminal is coupled to the interface circuit.

20 Claims, 26 Drawing Sheets

OSCILLATOR AND ELECTRONIC APPARATUS

The present application is based on, and claims priority from JP Application Serial Number 2019-228270 and 2019-228271, filed Dec. 18, 2019, the disclosures of which are hereby incorporated by reference herein in their entireties.

BACKGROUND

1. Technical Field

The present disclosure relates to an oscillator, an electronic apparatus, and the like.

2. Related Art

In the related art, an oscillator that generates a clock signal using an oscillation circuit is known. For example, as an oscillator using a resonator, an SPXO with no frequency compensation, a TCXO with temperature compensation of a frequency, or an OCXO in which a resonator is housed in a thermostatic chamber is known, and these oscillators output the generated clock signal to the outside. JP-A-2017-085535 discloses an oscillator that generates a clock signal and outputs the clock signal to the outside. Alternatively, an oscillator incorporating a PLL is known. JP-A-2018-037798 discloses a wireless communication device that incorporates an ADPLL and uses the ADPLL to perform frequency tracking on a reception signal. SPXO is an abbreviation for Simple Packaged Xtal Oscillator, TCXO is an abbreviation for Temperature Compensated Xtal Oscillator, and OCXO is an abbreviation for Oven Controlled Xtal Oscillator. PLL is an abbreviation for Phase Locked Loop, ADPLL is an abbreviation for All Digital PLL, and VCO is an abbreviation for Voltage Controlled Oscillator.

In the related art, there is no oscillator that outputs a clock signal generated by an oscillator to the outside and also obtains information indicating a relationship between the clock signal output to the outside and an external signal input to the oscillator from the outside. In the SPXO, TCXO, OCXO, and the oscillator of JP-A-2017-085535 described above, the external signal for comparison with the clock signal is not input to the oscillator, and information indicating the relationship between the clock signal and the external signal is not obtained. In JP-A-2018-037798, a clock signal such as a VCO signal is a clock signal for use inside the wireless communication device and is not output to the outside of the wireless communication device.

SUMMARY

An aspect of the present disclosure relates to an oscillator including a resonator, a clock signal generation circuit that oscillates the resonator to generate a clock signal, a clock signal output terminal that outputs the clock signal, an external signal input terminal that receives an external signal, an interface circuit that outputs time difference information obtained by measuring a time difference between a transition timing of a first signal based on the external signal input from the external signal input terminal and a transition timing of a second signal based on the clock signal, or frequency information obtained by measuring a frequency of a first clock signal, which is one of the clock signal and the external clock signal, based on a frequency of a second clock signal, which is the other of the clock signal and the external clock signal, and an interface terminal that is coupled to the interface circuit.

Another aspect of the present disclosure relates to an oscillator including a resonator, a clock signal generation circuit that oscillates the resonator to generate a clock signal, a clock signal output terminal that outputs the clock signal, an external signal input terminal that receives an external signal, and a time-to-digital conversion circuit that measures a time difference between a transition timing of a first signal based on the external signal input from the external signal input terminal and a transition timing of a second signal based on the clock signal and obtains time difference information corresponding to the time difference.

Still another aspect of the present disclosure relates to an oscillator including a resonator, a clock signal generation circuit that oscillates the resonator to generate a clock signal, a clock signal output terminal that outputs the clock signal, an external signal input terminal that receives an external clock signal, and a frequency measurement circuit that obtains frequency information corresponding to a frequency of a first clock signal, which is one of the clock signal and the external clock signal, by measuring the frequency of the first clock signal, based on a frequency of a second clock signal, which is the other of the clock signal and the external clock signal.

DESCRIPTION OF EXEMPLARY EMBODIMENTS

Hereinafter, a preferred embodiment of the present disclosure will be described in detail. The present embodiment described below does not unreasonably limit the contents described in the appended claims, and all the configurations described in the present embodiment are not necessarily essential constituent requirements.

1. First Configuration Example

Figure 1:
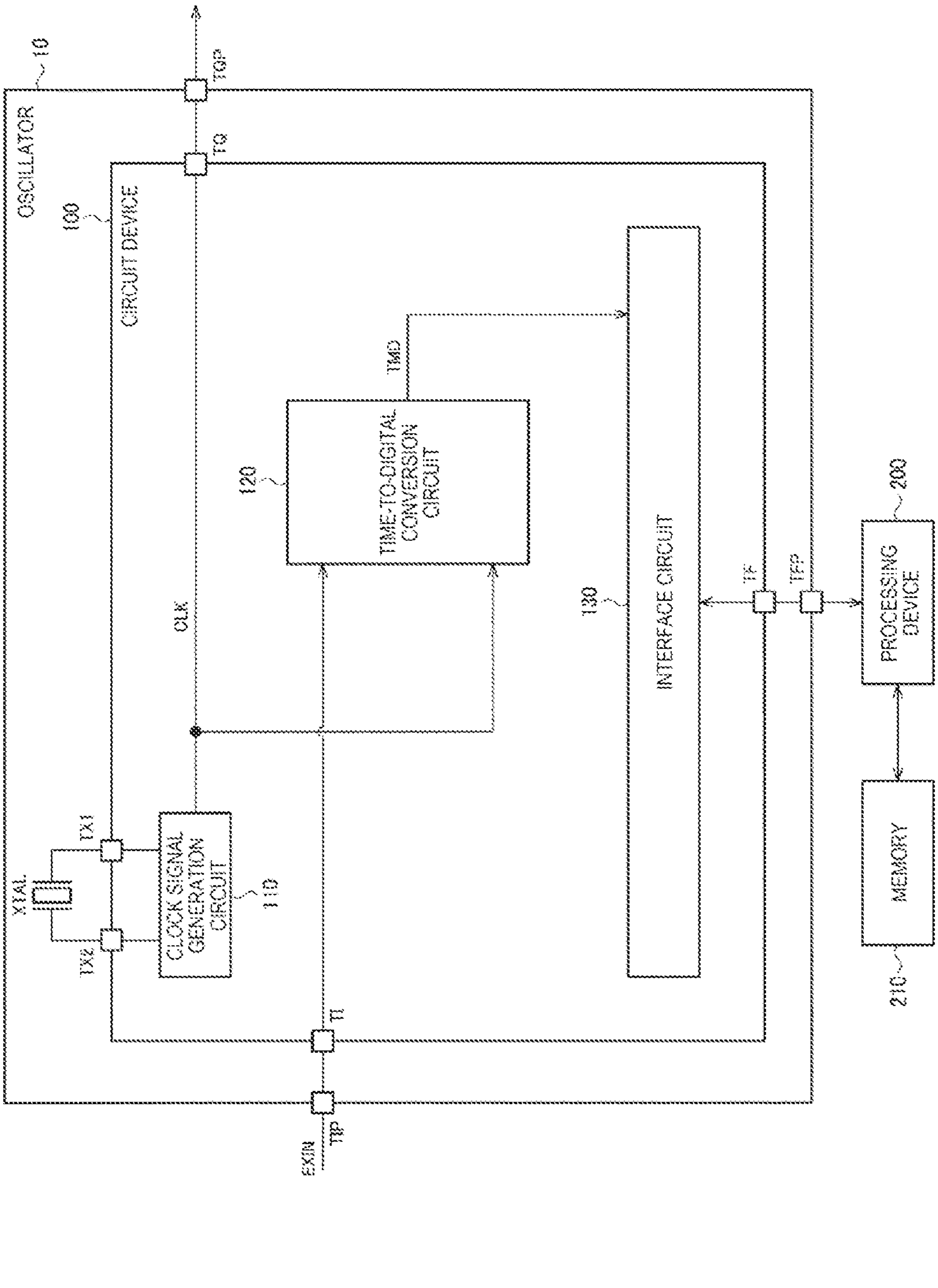
FIG. 1 illustrates a configuration example of an oscillator and a first configuration example of a circuit device.

FIG. 1 illustrates a configuration example of an oscillator 10 and a first configuration example of a circuit device 100. The oscillator 10 includes a circuit device 100, a resonator XTAL, and terminals TIP, TQP, and TFP. The TIP is an external signal input terminal, the TQP is a clock signal output terminal, and the TFP is an interface terminal.

The circuit device 100 generates a clock signal CLK using the resonator XTAL and also obtains time difference information TMD indicating a time difference between transition timings of an external signal EXIN input from the outside of the oscillator 10 and the clock signal CLK. The transition timing is a timing at which a voltage level of a signal changes, and is a rising edge or a falling edge of the signal. The circuit device 100 is an integrated circuit device called an integrated circuit (IC). The circuit device 100 is an IC manufactured by a semiconductor process, and is a semiconductor chip in which circuit elements are formed on a semiconductor substrate.

The resonator XTAL is an element that generates mechanical vibration by an electrical signal. The resonator XTAL can be realized by a resonator element such as a quartz crystal resonator element. For example, the resonator XTAL can be realized by a quartz crystal resonator element having a cut angle that vibrates in a thickness slip manner such as AT cut or SC cut. The resonator XTAL of the present embodiment can be realized by various resonator elements such as a resonator element other than a thickness shear vibration type resonator element or a piezoelectric resonator element formed of a material other than quartz crystal. For example, as the resonator XTAL, a SAW resonator or a MEMS resonator as a silicon resonator formed by using a silicon substrate may be adopted. SAW is an abbreviation for Surface Acoustic Wave, and MEMS is an abbreviation for Micro Electro Mechanical Systems.

The circuit device 100 and the resonator XTAL are electrically coupled to each other, and are configured as an oscillator module. For example, the circuit device 100 and the resonator XTAL are housed in a package. The package is configured with a container in which the circuit device 100 and the resonator XTAL are housed, and external coupling terminals TIP, TQP, and TFP provided in the container. The container is, for example, a ceramic container or a metal container, but is not limited thereto. The terminals TIP, TQP, AND TFP are metal leads or bumps provided at the outside of the container. The connection in the present embodiment is electrical coupling. The electrical coupling is coupling in which an electric signal can be transmitted, and is coupling in which information can be transmitted by the electric signal. The electrical coupling may be coupling via a passive element or an active element.

The circuit device 100 includes a clock signal generation circuit 110, a time-to-digital conversion circuit 120, an interface circuit 130, and terminals TX1, TX2, TI, TQ, and TF.

The terminals TX1, TX2, TI, TQ, and TF are pads formed on a semiconductor substrate. The terminal TX1 is coupled to one end of the resonator XTAL, and the terminal TX2 is coupled to the other end of the resonator XTAL. The terminal TI is coupled to the terminal TIP of the oscillator 10, the terminal TQ is coupled to the terminal TQP of the oscillator 10, and the terminal TF is coupled to the terminal TFP of the oscillator 10. These pieces of coupling are electrical coupling as described above, and are realized by, for example, in-package wiring, wire bonding, or metal bumps. One set of terminals TF and TFP is illustrated as the interface terminals, but is not limited thereto, and a plurality of sets of interface terminals may be provided according to a communication format of the interface circuit 130.

The clock signal generation circuit 110 is electrically coupled to the resonator XTAL via terminals TX1 and TX2, oscillates the resonator XTAL, and generates a clock signal CLK. The clock signal CLK is output to the outside of the oscillator 10 via the terminals TQ and TQP. The clock signal generation circuit 110 includes an oscillation circuit that oscillates the resonator XTAL to generate an oscillation clock signal. The clock signal CLK may be any clock signal based on the oscillation clock signal. For example, the clock signal generation circuit 110 may include an output circuit that buffers an oscillation clock signal and outputs oscillation clock signal as the clock signal CLK, a frequency division circuit that frequency-divides the oscillation clock signal and outputs the oscillation clock signal as the clock signal CLK, or a PLL circuit that generates the clock signal CLK using the oscillation clock signal as a reference clock signal.

The external signal EXIN is input to the terminal TIP from outside the oscillator 10. The external signal EXIN is a signal that makes a transition between a first voltage level and a second voltage level. The external signal EXIN may be a signal that makes a transition periodically, or a signal that makes a transition irregularly, and a clock signal, a pulse signal, a trigger signal, or the like can be assumed as the external signal EXIN. For example, the external signal EXIN may be a time signal input from a GNSS receiver or a network receiver, or an event signal input from a detection circuit that detects an occurrence of an event. When the GNSS is GPS, the external signal EXIN is a 1pps signal. GNSS is an abbreviation for Global Navigation Satellite System, and GPS is an abbreviation for Global Positioning System.

The external signal EXIN is input from the terminal TIP to the time-to-digital conversion circuit 120 via the terminal TI, and the clock signal CLK is input to the time-to-digital conversion circuit 120 from the clock signal generation circuit 110. The time-to-digital conversion circuit 120 measures a time difference between the transition timing of a first signal based on the external signal EXIN and the transition timing of a second signal based on the clock signal CLK, and obtains time difference information TMD corresponding to the time difference. The first signal is a signal whose transition timing is determined according to the transition timing of the external signal EXIN. For example, the first signal may be the external signal EXIN itself, a signal obtained by frequency-dividing the external signal EXIN, or a signal whose low level or high level is latched at the transition timing of the external signal EXIN. The second signal is a signal whose transition timing is determined according to the transition timing of the clock signal CLK. For example, the second signal may be the clock signal CLK itself, a signal obtained by frequency-dividing the clock signal CLK, or a signal whose low level or high level is latched at the transition timing of the clock signal CLK.

For example, the first signal is a start signal and the second signal is a stop signal. In this case, the time-to-digital conversion circuit 120 measures the time from the transition timing of the first signal to the transition timing of the second signal. Alternatively, the second signal may be a start signal and the first signal may be a stop signal. In this case, the time-to-digital conversion circuit 120 measures the time from the transition timing of the second signal to the transition timing of the first signal.

Figure 2:
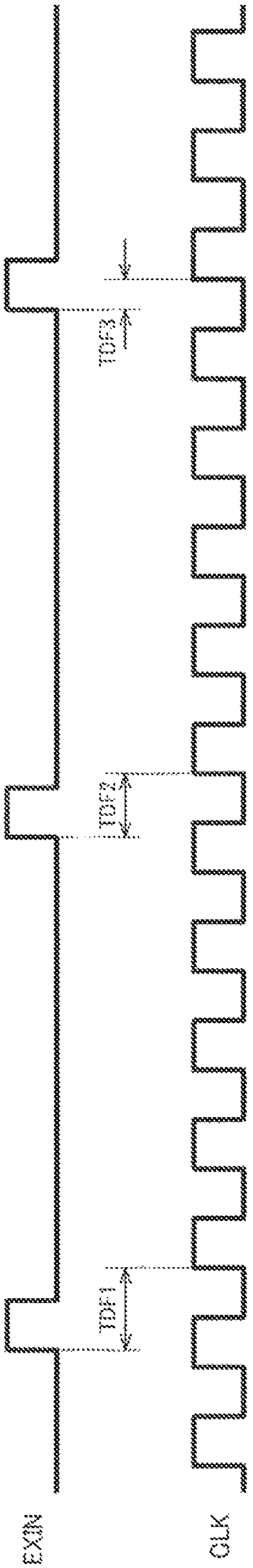
FIG. 2 illustrates an example of a time difference measured by a time-to-digital conversion circuit.

FIG. 2 illustrates an example of a time difference measured by the time-to-digital conversion circuit 120. In FIG. 2, the external signal EXIN is a start signal, the clock signal CLK is a stop signal, the external signal EXIN is a clock signal or a periodic pulse signal, and the transition timing is the rising edge timing.

The time-to-digital conversion circuit 120 measures the time difference from the transition timing of the external signal EXIN to the transition timing of the clock signal CLK. For example, the time-to-digital conversion circuit 120 measures the time difference from the transition timing of the external signal EXIN to the transition timing of the first clock signal CLK thereafter. This measurement is performed for each transition timing of the external signal EXIN, and time differences TDF1, TDF2, and TDF3 are obtained. Time difference information TMD is information indicating the time difference, and is specifically a digital value in which the time difference is encoded. For example, when the time-to-digital conversion circuit 120 measures time with time resolution $\Delta t$, the time difference is converted into a digital value with $\Delta t$ being 1 LSB.

Returning to FIG. 1, the interface circuit 130 will be described. The interface circuit 130 communicates with a processing device 200 provided outside the oscillator 10 and the oscillator 10 via the terminals TF and TFP. As the communication method of the interface circuit 130, various communication methods such as serial communication or parallel communication can be adopted. Examples of serial communication methods include SPI and I2C. The SPI is a three-wire or four-wire serial communication, which communicates using a chip select signal, a clock signal, and a data signal. The I2C is a two-wire serial communication, which communicates using a clock signal and a data signal. SPI is an abbreviation for Serial Peripheral Interface, and I2C is an abbreviation for Inter-Integrated Circuit.

The interface circuit 130 transmits the time difference information TMD from the time-to-digital conversion circuit 120 to the processing device 200. The processing device 200 performs signal processing using the time difference information TMD. The processing device 200 is a processor, and the processor is, for example, a microcomputer, a CPU, or a DSP. A memory 210 stores a program in which a signal processing procedure using the time difference information TMD is described. The processing device 200 executes a program stored in the memory 210 to perform signal processing using the time difference information TMD. The memory 210 is a non-volatile memory, or a semiconductor memory such as a ROM or a RAM. A user can write various programs in the memory 210, and various kinds of signal processing using the time difference information TMD can be realized by the programs. An example of signal processing using the time difference information TMD will be described later with reference to FIGS. 5 to 7.

According to the present embodiment, the clock signal CLK generated by the oscillator 10 is output to the outside, and the time difference information TMD indicating the time difference between the transition timing of the clock signal CLK and the transition timing of the external signal EXIN input to the oscillator 10 from the outside is obtained. With this configuration, various kinds of signal processing using the time difference information TMD can be realized. For example, as will be described later with reference to FIGS. 5 to 7, an ADPLL, DLL, a transmission delay measuring device, or the like can be configured.

For example, a synchronization system such as an ADPLL using a time-to-digital conversion circuit of the related art is known, but the synchronization system cannot be used for purposes other than the ADPLL because the synchronization system is configured as the ADPLL, as a matter of course. Even in the case of ADPLL, control algorithm of a feedback loop or the like is limited to the algorithm implemented in the product, and it is difficult for the user to use a unique function or control algorithm. That is, the ADPLL of the related art has limited customizability. In this respect, the oscillator 10 of the present embodiment can be used not only for the ADPLL but also for various purposes, and the function and control algorithm thereof can be freely customized by the user.

In the present embodiment, the interface circuit 130 outputs the time difference information TMD to the outside of the oscillator 10. With this configuration, the oscillator 10 and the outside thereof are interfaced with only digital signals of the external signal EXIN, the clock signal CLK, and the time difference information TMD. That is, when a system such as an ADPLL using the oscillator 10 is configured, the oscillation circuit and the time-to-digital conversion circuit, which are analog parts thereof, are packaged as the oscillator 10, and thus only a digital processing circuit such as a processor may be used outside the oscillator 10. With this configuration, the user may develop algorithms for digital processing without incurring a design burden of the analog part of the system. That is, by using the oscillator 10 of the present embodiment, system development such as a synchronization system is simplified.

In the present embodiment, the clock signal generation circuit 110, the time-to-digital conversion circuit 120, and the interface circuit 130 are provided in one semiconductor substrate. With this configuration, as compared with the case where the clock signal generation circuit 110 and the time-to-digital conversion circuit 120 are configured as separate ICs, a delay or waveform deformation of a signal to be measured can be suppressed, and thus the time-to-digital conversion circuit 120 can measure an accurate time difference.

2. Second Configuration Example and Third Configuration Example

Figure 3:
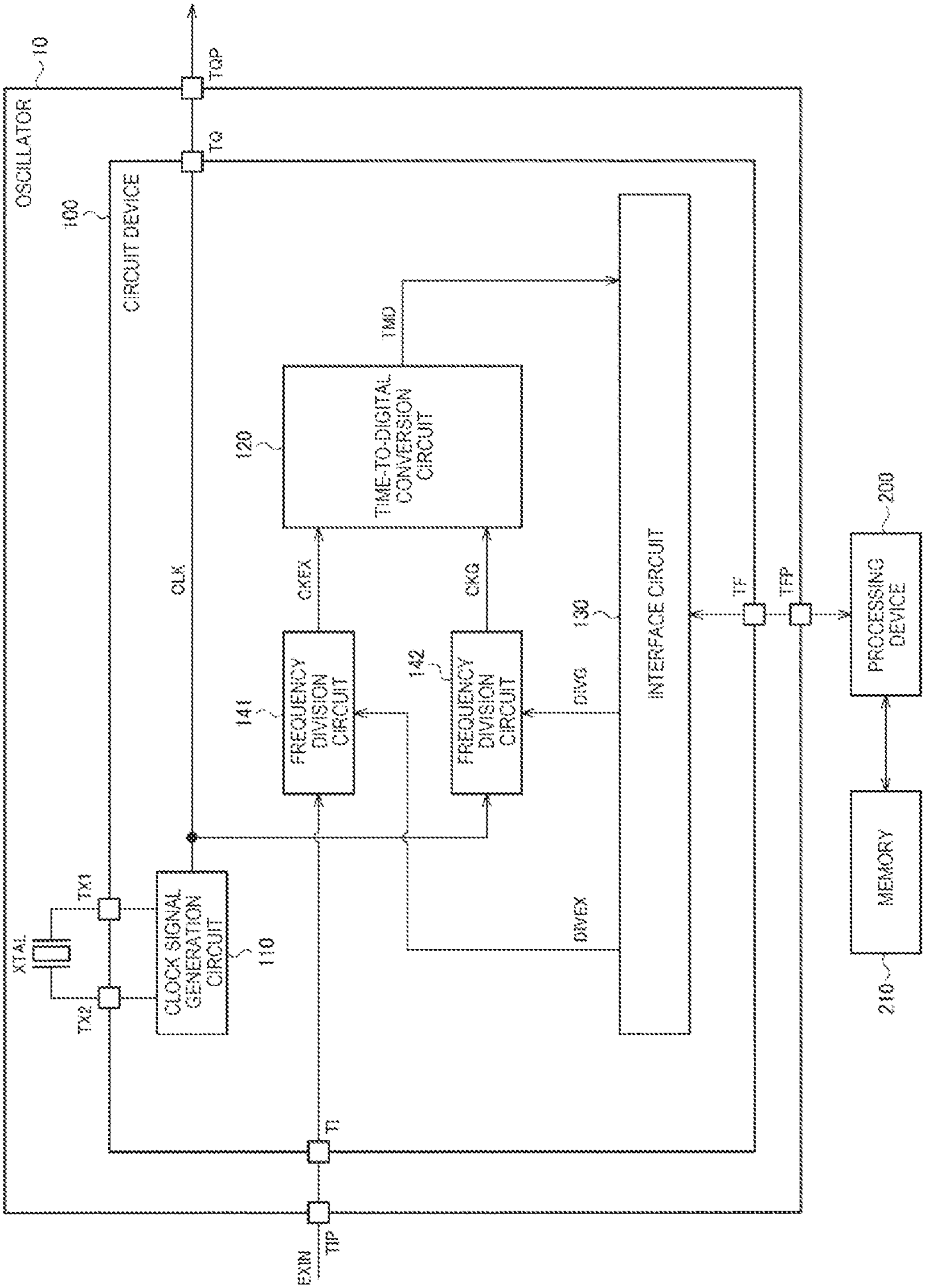
FIG. 3 illustrates a second configuration example of the circuit device.

FIG. 3 illustrates second configuration example of the circuit device 100. In the second configuration example, the circuit device 100 further includes a frequency division circuit 141 that is a first frequency division circuit and a frequency division circuit 142 that is a second frequency division circuit. The same components as those already described are designated by the same reference numerals, and the description of the components will be appropriately omitted.

An external clock signal is input to the terminal TIP as the external signal EXIN. The external clock signal is a time signal input from a GNSS receiver or network receiver, a clock signal generated by an oscillator provided outside the oscillator 10, or the like.

The interface circuit 130 receives frequency division ratio setting information DIVEX for setting a first frequency division ratio, which is a frequency division ratio of the frequency division circuit 141, from the processing device 200, and outputs the frequency division ratio setting information DIVEX to the frequency division circuit 141. The interface circuit 130 receives frequency division ratio setting information DIVG for setting a second frequency division ratio, which is a frequency division ratio of the frequency division circuit 142, from the processing device 200, and outputs the frequency division ratio setting information DIVG to the frequency division circuit 142.

The frequency division circuit 141 frequency-divides an external clock signal, which is the external signal EXIN, by the first frequency division ratio based on the frequency division ratio setting information DIVEX, and outputs a frequency divided clock signal CKEX obtained by the frequency division to the time-to-digital conversion circuit 120. The frequency divided clock signal CKEX is the first frequency divided clock signal and is the first signal in time-to-digital conversion.

The frequency division circuit 142 frequency-divides the clock signal CLK from the clock signal generation circuit 110 by the second frequency division ratio based on the frequency division ratio setting information DIVG, and outputs a frequency divided clock signal CKG obtained by the frequency division to the time-to-digital conversion circuit 120. The frequency divided clock signal CKG is the second frequency divided clock signal and is the second signal in time-to-digital conversion.

The time-to-digital conversion circuit 120 measures a phase difference between the frequency divided clock signal CKEX and the frequency divided clock signal CKG as the time difference, and obtains the time difference information TMD.

According to the present embodiment, the frequencies of the first signal and the second signal input to the time-to-digital conversion circuit 120 can be randomly set by the frequency division ratio setting information DIVEX and DIVG. With this configuration, it is possible to adjust the cycles of the first signal and the second signal whose transition timings are compared by the time-to-digital conversion circuit 120. For example, when the cycle of the clock signal CLK or the external clock signal is shorter than the conversion time of the time-to-digital conversion circuit 120, the conversion time can be secured by the frequency division circuits 141 and 142.

In FIG. 3, although the circuit device 100 includes both the frequency division circuits 141 and 142, the circuit device 100 may include only one of the frequency division circuits 141 and 142.

Figure 4:
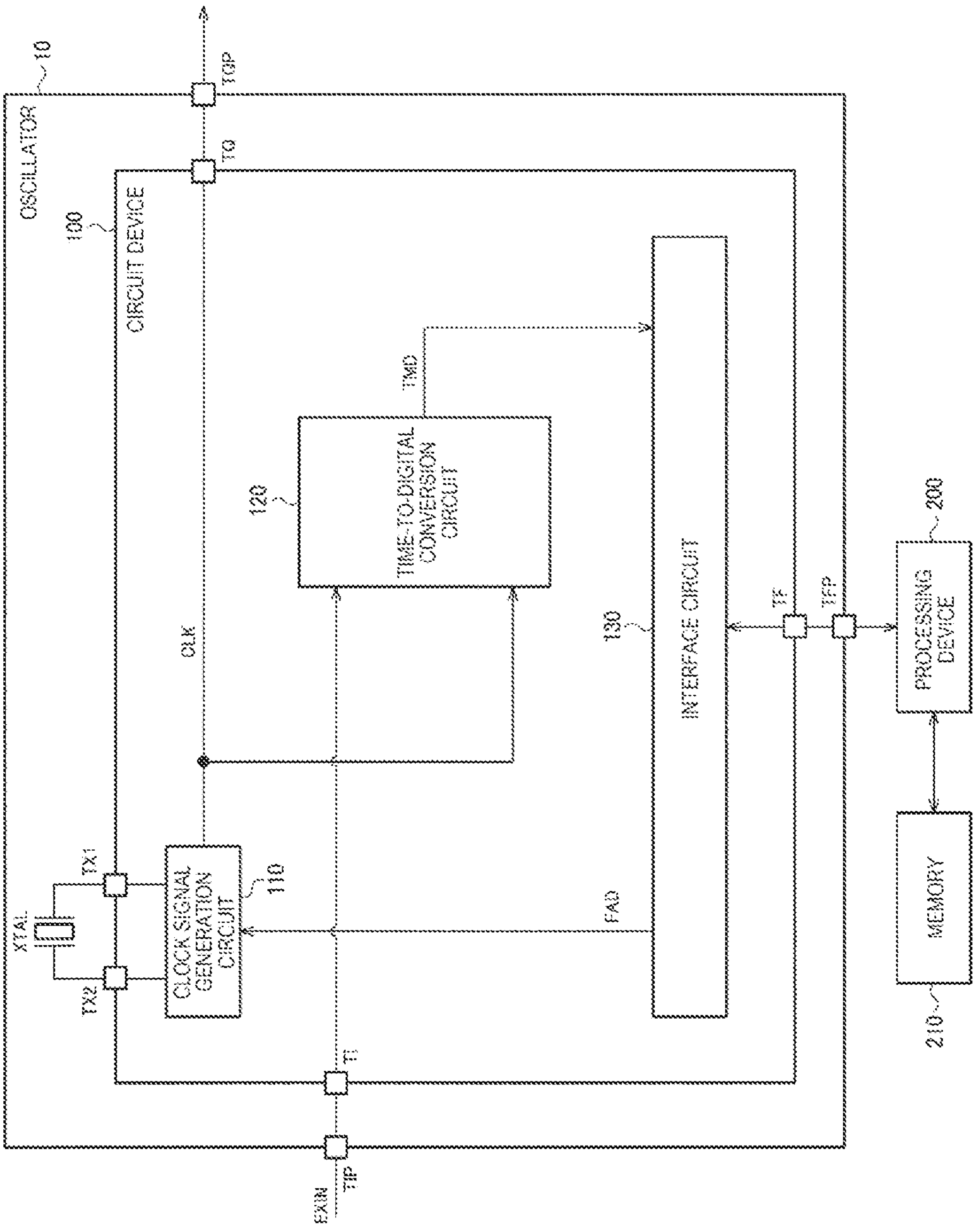
FIG. 4 illustrates a third configuration example of the circuit device.

FIG. 4 illustrates a third configuration example of the circuit device 100. The same components as those already described are designated by the same reference numerals, and the description of the components will be appropriately omitted.

In the third configuration example, the interface circuit 130 receives frequency adjustment data FAD from the processing device 200 and outputs the frequency adjustment data FAD to the clock signal generation circuit 110. The clock signal generation circuit 110 adjusts the frequency of the clock signal CLK based on the frequency adjustment data FAD. Specifically, the clock signal generation circuit 110 generates the clock signal CLK having a frequency according to the frequency adjustment data FAD.

The frequency adjustment data FAD is data in which the frequency of the clock signal CLK changes when the value of the frequency adjustment data FAD changes, but the value of the frequency adjustment data FAD and the frequency of the clock signal CLK does not need to have a one-to-one correspondence. That is, the frequency of the clock signal CLK may change due to process variations, power supply voltage variations, or temperature variations, and thus the frequency of the clock signal CLK may change even if the frequency adjustment data FAD does not change.

According to the present embodiment, it becomes possible to adjust the frequency of the clock signal CLK output from the oscillator 10 by the frequency adjustment data FAD. For example, by using the frequency adjustment data FAD generated based on the time difference information TMD, the clock signal CLK can be frequency-synchronized or phase-synchronized with the external signal EXIN.

The second configuration example and the third configuration example may be combined. That is, the circuit device 100 of FIG. 4 may further include the frequency division circuits 141 and 142 of FIG. 3, and the frequency divided clock signals CKEX and CKG may be input to the time-to-digital conversion circuit 120.

3. System Configuration Example

Figure 5:
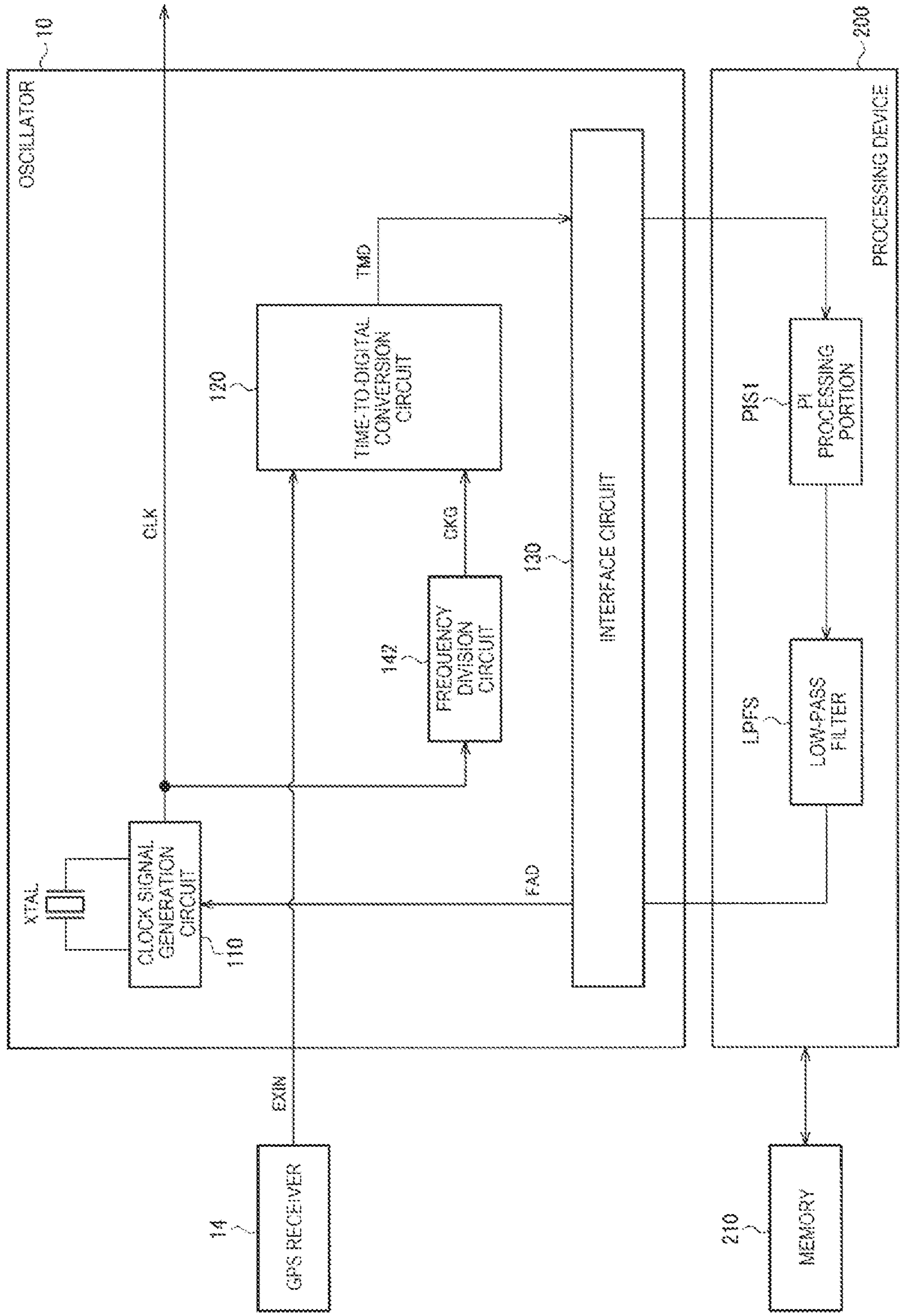
FIG. 5 illustrates a system configuration example of a GPS synchronization module using an oscillator.
Figure 6:
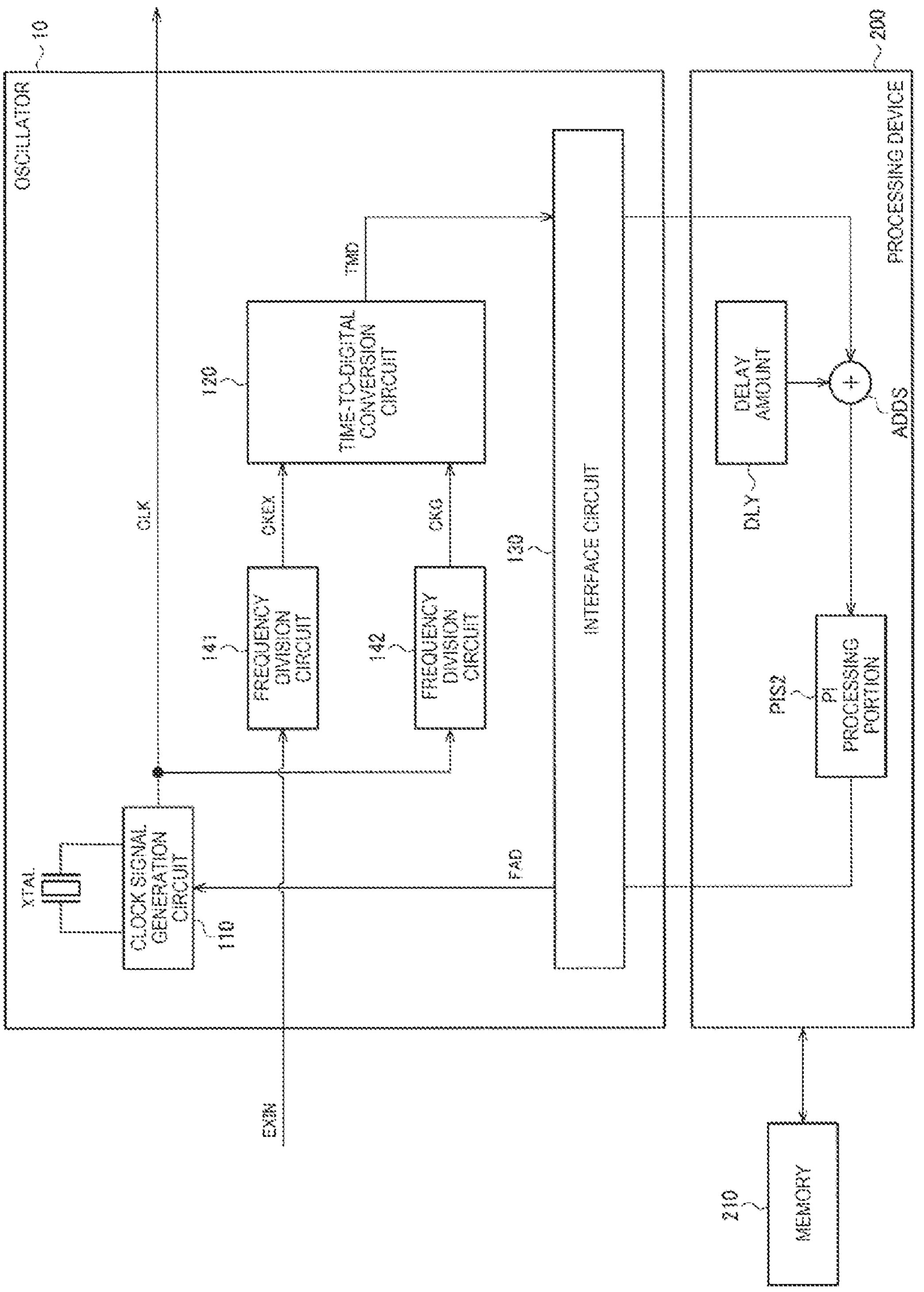
FIG. 6 illustrates a system configuration example of a DLL using the oscillator.
Figure 7:
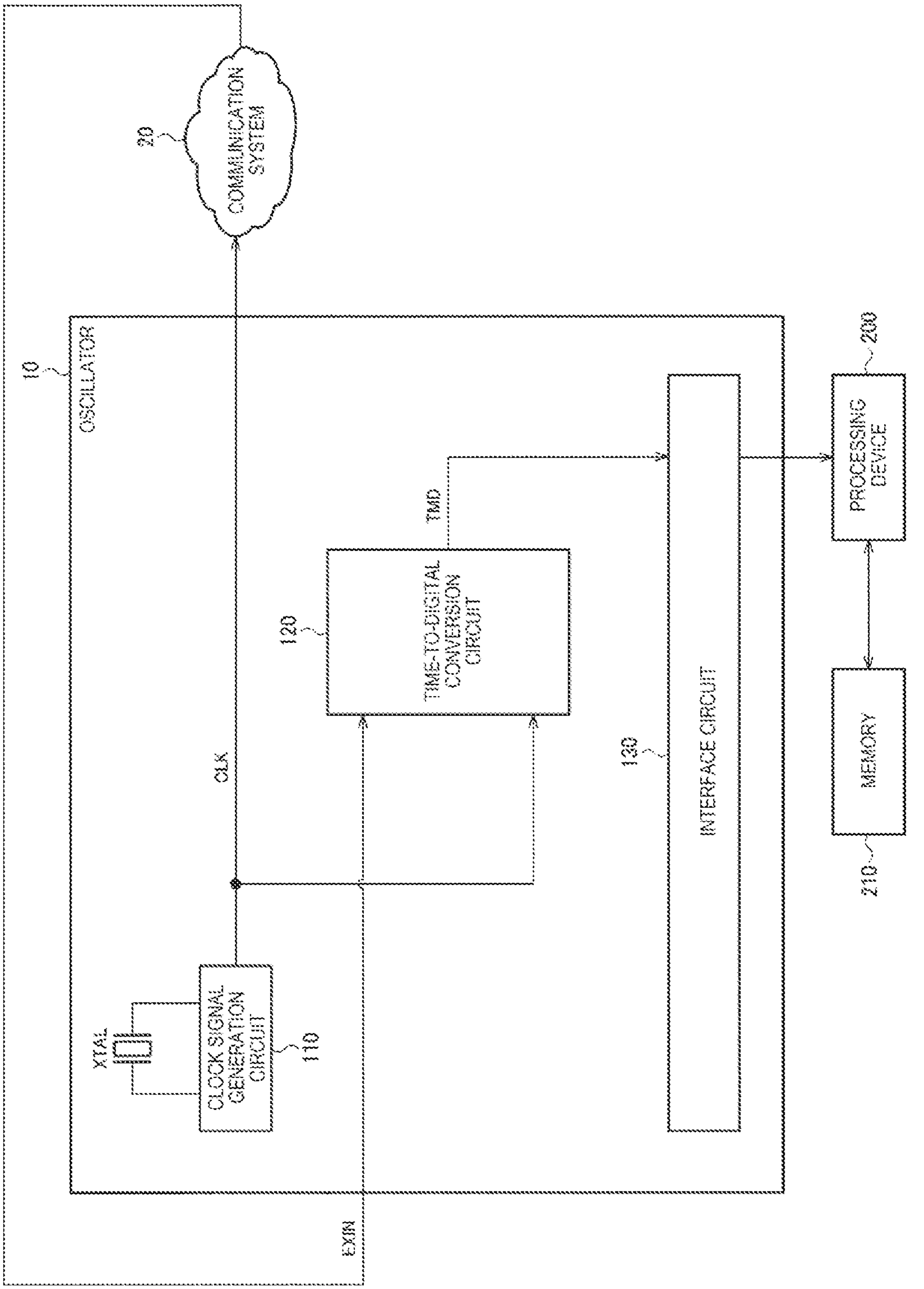
FIG. 7 illustrates an example of a system configuration for measuring communication transmission delay using the oscillator.

A configuration example of a system using the oscillator 10 will be described with reference to FIGS. 5 to 7. In FIGS. 5 to 7, only the internal configuration of the circuit device 100 and the resonator XTAL in the oscillator 10 are illustrated. Also, illustration of terminals is omitted.

FIG. 5 illustrates an example of a system configuration of a GPS synchronization module using the oscillator 10. The system of FIG. 5 includes a GPS receiver 14, an oscillator 10, a processing device 200, and a memory 210.

The GPS receiver 14 receives a GPS satellite signal and outputs a 1pps signal to the oscillator 10 as the external signal EXIN. 1pps is a signal serving as a time reference and is a 1 Hz pulse signal.

The time-to-digital conversion circuit 120 measures the time difference between the transition timings of the 1pps signal and the frequency divided clock signal CKG, and outputs the time difference information TMD. The time difference is measured for each transition timing of the 1pps signal, and the time difference information TMD indicating the time differences in time series is output. The interface circuit 130 outputs the time difference information TMD to the processing device 200.

The processing device 200 includes a PI processing portion PIS1 and a low-pass filter LPFS. The PI processing portion PIS1 integrates the time differences in time series input as the time difference information TMD. The low-pass filter LPFS performs low-pass filter processing on the output of the PI processing portion PIS1. The PI processing portion PIS1 and the low-pass filter LPFS correspond to a loop filter in the PLL. The processing device 200 outputs an output of the low-pass filter LPFS to the oscillator 10 as frequency adjustment data FAD.

The clock signal generation circuit 110 adjusts the frequency of the clock signal CLK based on the frequency adjustment data FAD received by the interface circuit 130. With this configuration, the clock signal CLK that is phase-synchronized with 1pps and multiplied by 1pps is obtained. The multiplication rate is determined by the frequency division ratio of the frequency division circuit 142.

According to the system of FIG. 5, an ADPLL with a 1pps signal as a reference signal is realized. In this system, since an analog circuit such as an oscillation circuit or a time-to-digital conversion circuit is prepared inside the oscillator 10, only digital processing such as PI control and low-pass filter processing needs to be configured outside the oscillator 10. By writing a program in the memory 210, digital processing of various algorithms can be used. That is, it is possible to customize algorithms of the PI control and low-pass filter processing, or it is possible to customize not only the PI control and low-pass filter processing but also by what algorithm the feedback loop is formed. Alternatively, various additional functions can be added.

FIG. 6 is an example of a system configuration of a DLL using the oscillator 10. The system of FIG. 6 includes the oscillator 10, the processing device 200, and a memory 210. DLL is an abbreviation for Delay Locked Loop.

An external clock signal is input to the oscillator 10 as the external signal EXIN. The time-to-digital conversion circuit 120 measures the time difference between the transition timings of the frequency divided clock signal CKEX and the frequency divided clock signal CKG, and outputs the time difference information TMD. The time difference is measured for each transition timing of the frequency divided clock signal CKEX, and time difference information TMD indicating the time differences in time series are output. The interface circuit 130 outputs the time difference information TMD to the processing device 200.

The processing device 200 includes an adder ADDS and a PI processing portion PIS2. The adder ADDS adds each time difference of the time differences in time series input as the time difference information TMD and a delay amount DLY. The delay amount DLY indicates a phase delay amount of the clock signal CLK which is set with respect to the external clock signal. The PI processing portion PIS2 integrates the output of the adder ADDS. The processing device 200 outputs the output of the PI processing portion PIS2 to the oscillator 10 as the frequency adjustment data FAD.

The clock signal generation circuit 110 adjusts the frequency of the clock signal CLK based on the frequency adjustment data FAD received by the interface circuit 130. With this configuration, the clock signal CLK whose phase delay is locked to the delay amount DLY with respect to the external clock signal is generated. For example, when one cycle of the clock signal CLK is 360 degrees and the delay amount DLY corresponds to 90 degrees, the clock signal CLK whose phase is delayed by 90 degrees with respect to the external clock signal is generated.

According to the system of FIG. 6, a DLL using an external clock signal as a reference signal is realized. In this system, since an analog circuit such as an oscillation circuit or a time-to-digital conversion circuit is prepared inside the oscillator 10, only digital processing such as addition processing and PI control needs to be configured outside the oscillator 10. By writing a program in the memory 210, digital processing of various algorithms can be used. That is, it is possible to customize the algorithm of addition processing and the PI control, or it is possible to customize not only the addition processing and the PI control algorithm but also by what algorithm the feedback loop is formed. Alternatively, various additional functions can be added.

FIG. 7 illustrates an example of a system configuration in which a communication transmission delay is measured using the oscillator 10. The system of FIG. 7 includes the oscillator 10, the processing device 200, the memory 210, and a communication system 20.

The communication system 20 includes a transmission circuit, a transmission line, and a reception circuit. The transmission line is, for example, a wired transmission line, a wireless transmission line, or a network. Based on the clock signal CLK output from the oscillator 10, the transmission circuit outputs a transmission signal to the transmission line. The reception circuit receives the transmission signal transmitted through the transmission line and outputs the external signal EXIN to the oscillator 10. For example, the reception circuit generates a pulse signal that indicates the timing of receiving the transmission signal, and outputs the pulse signal as the external signal EXIN.

The time-to-digital conversion circuit 120 measures the time difference between the transition timings of the external signal EXIN and the clock signal CLK, and outputs the time difference information TMD. The interface circuit 130 outputs the time difference information TMD to the processing device 200.

The processing device 200 obtains the transmission delay time in the communication system 20 based on the time difference information TMD. The transmission delay time indicates a delay time caused by communication in the communication system 20, and specifically indicates the time from the time when the transmission circuit transmits a transmission signal to the time when the reception circuit receives the transmission signal.

According to the system of FIG. 7, a system for measuring communication transmission delay can be configured. As described above, by using the oscillator 10, not only the synchronization system of the clock signal CLK but also various systems not intended for synchronization can be configured. In this system, since an analog circuit such as an oscillation circuit or a time-to-digital conversion circuit is prepared inside the oscillator 10, only digital processing such as delay measurement processing needs to be configured outside the oscillator 10. By writing a program in the memory 210, digital processing of various algorithms can be used, and various systems using the oscillator 10 can be configured.

4. Clock Signal Generation Circuit

Figure 8:
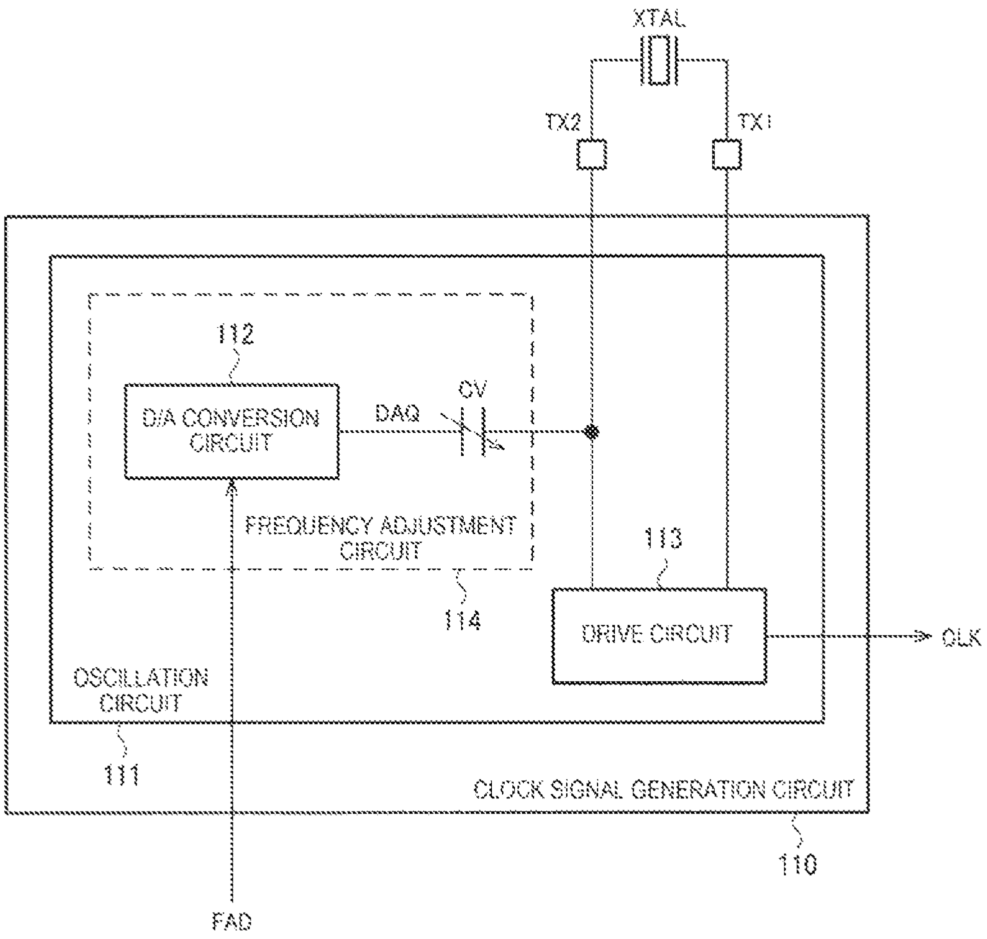
FIG. 8 illustrates a first detailed configuration example of a clock signal generation circuit.

FIG. 8 illustrates a first detailed configuration example of the clock signal generation circuit 110. The clock signal generation circuit 110 includes an oscillation circuit 111 which is a DCXO. DCXO is an abbreviation for Digital Controlled Xtal Oscillator.

The oscillation circuit 111 generates an oscillation clock signal by oscillating the resonator XTAL. The oscillation circuit 111 adjusts a frequency of the oscillation clock signal based on the frequency adjustment data FAD and outputs the oscillation clock signal as the clock signal CLK. Specifically, the oscillation circuit 111 includes a drive circuit 113 and a frequency adjustment circuit 114.

The drive circuit 113 is electrically coupled to the resonator XTAL via terminals TX1 and TX2, drives the resonator XTAL to oscillate, and outputs an oscillation clock signal as a clock signal CLK.

The frequency adjustment circuit 114 is coupled to a node coupling the terminal TX1 or the terminal TX2 and the drive circuit 113, and adjusts an oscillation frequency based on the frequency adjustment data FAD. FIG. 8 illustrates a case where the frequency adjustment circuit 114 is coupled to a node coupling the terminal TX2 and the drive circuit 113. The frequency adjustment circuit 114 includes a D/A conversion circuit 112 and a variable capacitance capacitor CV. The D/A conversion circuit 112 D/A converts the frequency adjustment data FAD, and outputs a voltage DAQ obtained by the D/A conversion to one end of the variable capacitance capacitor CV. The other end of the variable capacitance capacitor CV is coupled to the node coupling the terminal TX2 and the drive circuit 113. The variable capacitance capacitor CV is a capacitor whose capacitance value changes according to a voltage across the variable capacitance capacitor CV, and is, for example, a MOS capacitor or a variable capacitance diode.

According to the present embodiment, the voltage DAQ at one end of the variable capacitance capacitor CV changes according to the frequency adjustment data FAD, and thus a capacitance value of the variable capacitance capacitor CV changes according to the frequency adjustment data FAD. With this configuration, a capacitive load of the drive circuit 113 that drives the resonator XTAL changes, and thus the frequency of the clock signal CLK changes according to the frequency adjustment data FAD.

Figure 9:
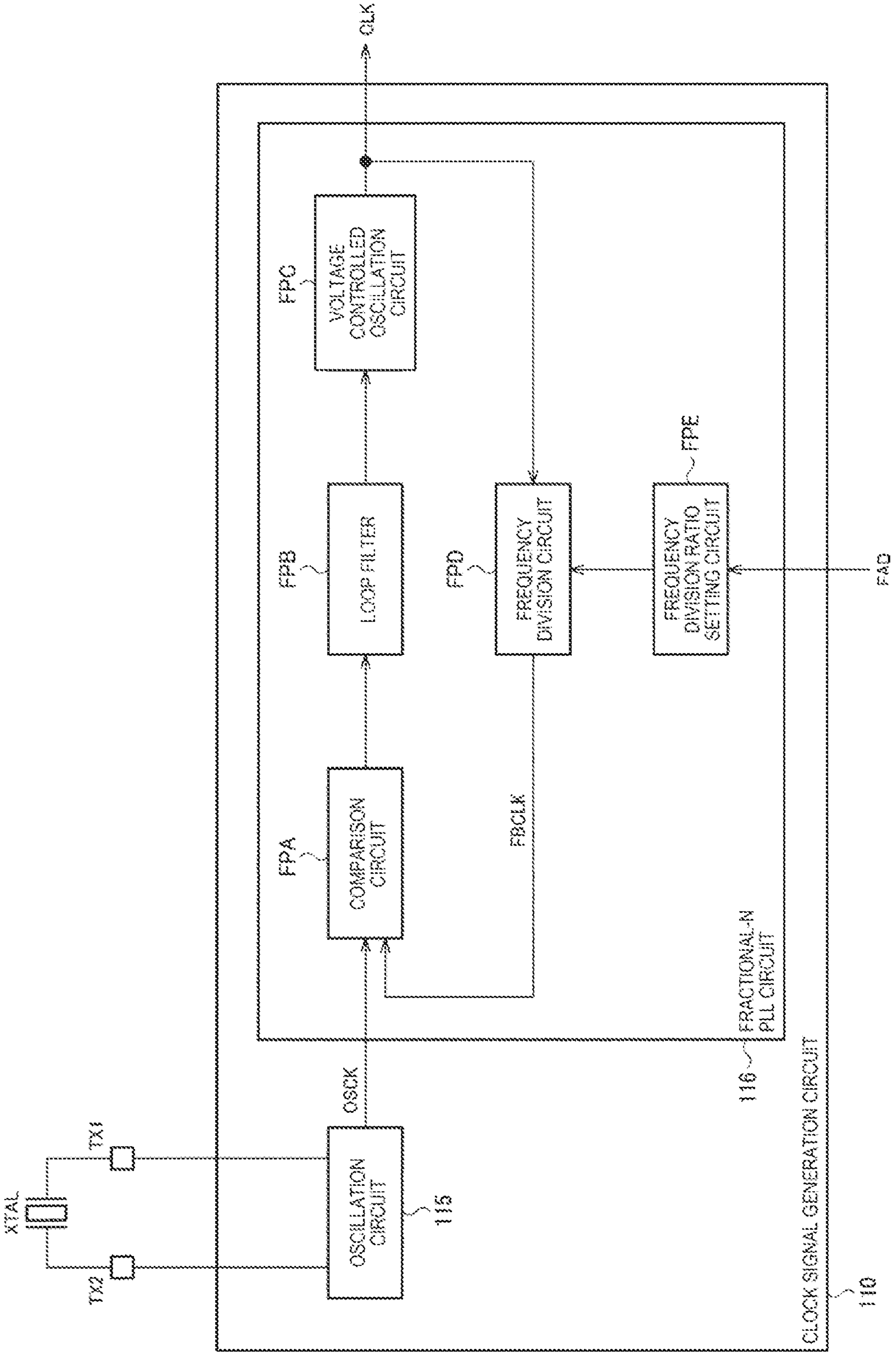
FIG. 9 illustrates a second detailed configuration example of the clock signal generation circuit.

FIG. 9 illustrates a second detailed configuration example of the clock signal generation circuit 110. The clock signal generation circuit 110 includes an oscillation circuit 115 and a fractional-N PLL circuit 116.

The oscillation circuit 115 is electrically coupled to the resonator XTAL via the terminals TX1 and TX2, oscillates the resonator XTAL to generate an oscillation clock signal OSCK, and outputs the oscillation clock signal OSCK to the fractional-N PLL circuit 116. As the oscillation circuit 115, various types of oscillation circuits such as a Pierce type oscillation circuit, a Colpitts type oscillation circuit, an inverter type oscillation circuit, and a Hartley type oscillation circuit can be used.

The oscillation clock signal OSCK is input to the fractional-N PLL circuit 116 as a reference clock signal. The fractional-N PLL circuit 116 generates a clock signal CLK having a frequency obtained by multiplying the frequency of the reference clock signal by a fraction based on the frequency adjustment data FAD. Specifically, the fractional-N PLL circuit 116 includes a comparison circuit FPA, a loop filter FPB, a voltage controlled oscillation circuit FPC, a frequency division circuit FPD, and a frequency division ratio setting circuit FPE.

The frequency division circuit FPD frequency-divides the clock signal CLK and outputs the frequency divided clock signal as a feedback clock signal FBCLK. The comparison circuit FPA compares the phases of the oscillation clock signal OSCK and the feedback clock signal FBCLK. The loop filter FPB outputs a control voltage by performing loop filter processing on the output signal of the comparison circuit FPA. The voltage controlled oscillation circuit FPC oscillates at an oscillation frequency corresponding to the control voltage and outputs a clock signal CLK obtained by the oscillation.

The frequency division ratio setting circuit FPE sets a fractional frequency division ratio based on the frequency adjustment data FAD, and outputs information on the frequency division ratio to the frequency division circuit FPD. The frequency division circuit FPD frequency-divides the clock signal CLK at a frequency division ratio instructed by the information on the frequency division ratio. Specifically, the frequency division ratio setting circuit FPE changes an integer frequency division ratio in time series to set a frequency division ratio that is a fraction as a time average. The frequency division circuit FPD frequency-divides the clock signal CLK by the integer frequency division ratio, but since the integer frequency division ratio changes in time series, the clock signal CLK is frequency-divided by a fractional fraction ratio as a time average.

According to the present embodiment, the fractional-N PLL circuit 116 adjusts the frequency division ratio of the feedback loop based on the frequency adjustment data FAD. Since the frequency division ratio of the feedback loop changes according to the frequency adjustment data FAD, a fractional multiplication rate of the fractional-N PLL circuit 116 changes according to the frequency adjustment data FAD. With this configuration, the frequency of the clock signal CLK changes according to the frequency adjustment data FAD. The feedback loop is a loop in which the feedback clock signal FBCLK is fed back from the oscillation circuit 115 to the comparison circuit FPA via the frequency division circuit FPD.

5. Fourth Configuration Example and Fifth Configuration Example

Figure 10:
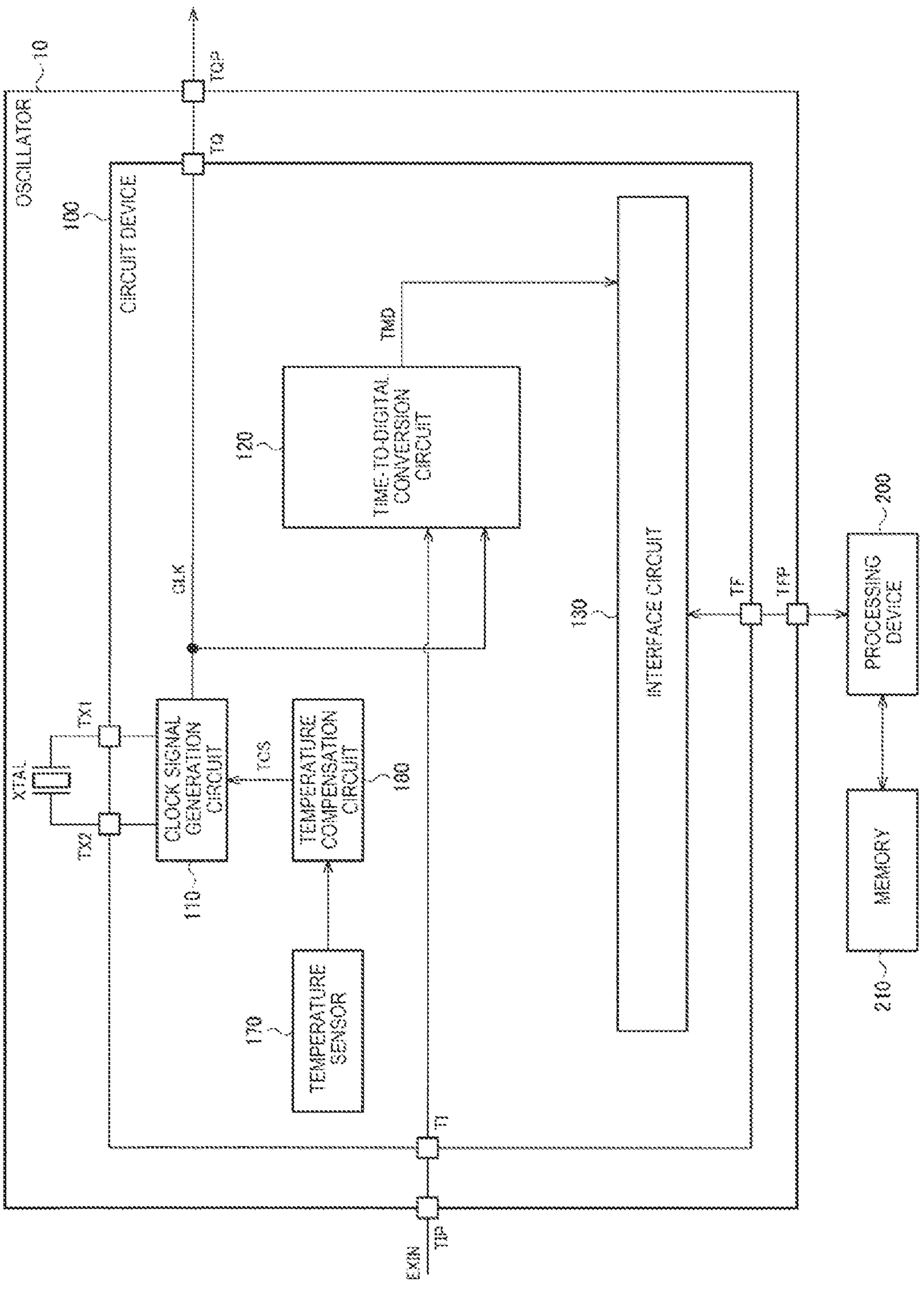
FIG. 10 illustrates a fourth configuration example of the circuit device.

FIG. 10 illustrates a fourth configuration example of the circuit device 100. In the fourth configuration example, the circuit device 100 further includes a temperature sensor 170 and a temperature compensation circuit 180.

First, a case where the temperature compensation circuit 180 generates a digital temperature compensation signal TCS by digital processing will be described. The digital temperature compensation signal TCS is also called temperature compensation data.

The temperature sensor 170 includes a sensor portion and an A/D converter. The sensor portion senses temperature and outputs a temperature detection voltage that depends on the temperature. For example, the sensor portion includes an element having a PN junction and outputs a temperature detection voltage based on a forward voltage of the PN junction. The element having the PN junction is a diode, a bipolar transistor, or the like. The A/D conversion circuit A/D-converts the temperature detection voltage and outputs temperature data obtained by the A/D conversion.

The temperature compensation circuit 180 generates temperature compensation data based on the temperature data. Specifically, the temperature compensation circuit 180 converts the temperature data into temperature compensation data based on a polynomial approximation in which temperature is a variable. A polynomial used for the polynomial approximation is a polynomial that compensates for temperature dependence of the resonator XTAL and the oscillation frequency of the clock signal generation circuit 110.

The clock signal generation circuit 110 adjusts the frequency of the clock signal CLK based on the temperature compensation signal TCS which is the temperature compensation data. Specifically, the clock signal generation circuit 110 generates the clock signal CLK having a frequency according to the temperature compensation data. With this configuration, the clock signal CLK of which the temperature dependence of frequency is compensated is generated.

As the configuration of the clock signal generation circuit 110, the configuration of FIG. 8 or 9 can be used. When the configuration of FIG. 8 is adopted, temperature compensation data is input to the D/A conversion circuit 112 instead of the frequency adjustment data FAD. With this configuration, the oscillation circuit 111 adjusts the frequency of the clock signal CLK based on the temperature compensation data. When the configuration of FIG. 9 is adopted, the temperature compensation data is input to the frequency division ratio setting circuit FPE instead of the frequency adjustment data FAD. With this configuration, the fractional-N PLL circuit 116 adjusts the frequency of the clock signal CLK by adjusting the frequency division ratio of the feedback loop based on the temperature compensation data.

The second or third configuration example may be combined with the fourth configuration example of FIG. 10. When the second and fourth configuration examples are combined, the circuit device 100 of FIG. 10 further includes the frequency division circuits 141 and 142. When the third and fourth configuration examples are combined, the clock signal generation circuit 110 in FIG. 10 further adjusts the frequency of the clock signal CLK based on the frequency adjustment data FAD. For example, temperature compensation data is added to the frequency adjustment data FAD, the added value thereof is input to the clock signal generation circuit 110, and the clock signal generation circuit 110 adjusts the frequency of the clock signal based on the added value. The second configuration example, the third configuration example, and the fourth configuration example may be combined.

The temperature compensation circuit 180 may generate an analog temperature compensation signal TCS by analog processing. The analog temperature compensation signal TCS is also called a temperature compensation voltage. In this case, the temperature sensor 170 includes a sensor portion and outputs a temperature detection voltage. The temperature compensation circuit 180 includes an analog circuit that performs a polynomial approximation with temperature as a variable, and the analog circuit converts the temperature detection voltage into the temperature compensation voltage. The clock signal generation circuit 110 generates a clock signal CLK having a frequency according to the temperature compensation voltage. With this configuration, the clock signal CLK of which the temperature dependence of the frequency is compensated is generated. As the configuration of the clock signal generation circuit 110, the variable capacitance capacitor CV and the drive circuit 113 of FIG. 8 can be used. That is, in FIG. 8, the D/A conversion circuit 112 is omitted and the temperature compensation voltage is input to one end of the variable capacitance capacitor CV instead of the voltage DAQ.

Figure 11:
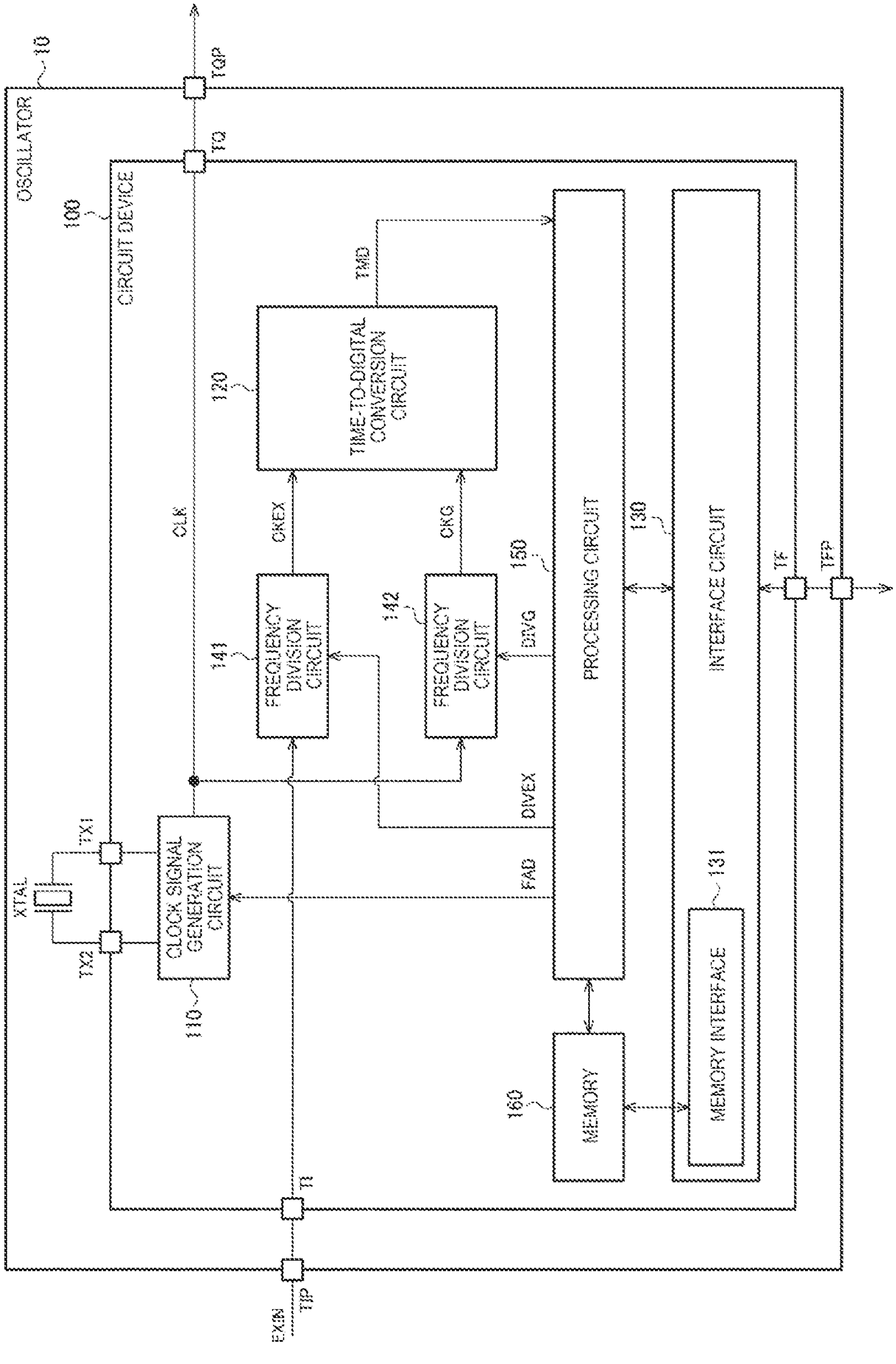
FIG. 11 illustrates a fifth configuration example of the circuit device.

FIG. 11 illustrates a fifth configuration example of the circuit device 100. In the fifth configuration example, the circuit device 100 further includes a processing circuit 150 and a memory 160. The interface circuit 130 also includes a memory interface 131.

The processing circuit 150 included in the circuit device 100 corresponds to the processing device 200 provided outside the oscillator 10. That is, the processing circuit 150 performs signal processing using the time difference information TMD. Specifically, the processing circuit 150 generates frequency adjustment data FAD according to the time difference information TMD. The clock signal generation circuit 110 adjusts the frequency of the clock signal CLK based on the frequency adjustment data FAD. A method by which the processing circuit 150 generates the frequency adjustment data FAD is as described in FIGS. 4 to 6. The processing circuit 150 is a processor, and the processor is, for example, a microcomputer, a CPU core, or a DSP. The circuit device 100 including the processing circuit 150 is an integrated circuit device. That is, the processing circuit 150 and the memory 160 are provided in one integrated circuit device together with the clock signal generation circuit 110, the time-to-digital conversion circuit 120, and the interface circuit 130.

The memory 160 included in the circuit device 100 corresponds to the memory 210 provided outside the oscillator 10. That is, the memory 160 stores a program in which a procedure of signal processing using the time difference information TMD is described. Specifically, the memory 160 stores a program for the processing circuit 150 to generate the frequency adjustment data FAD based on the time difference information TMD. The processing circuit 150 executes the program stored in the memory 160 to perform signal processing using the time difference information TMD. The processing circuit 150 may output the frequency division ratio setting information DIVEX and DIVG to the frequency division circuits 141 and 142, respectively, by executing the program stored in the memory 160. The memory 160 is a semiconductor memory such as a non-volatile memory or a RAM.

The interface circuit 130 includes the memory interface 131 for accessing the memory 160 from outside the oscillator 10. The memory interface 131 writes the program received by the interface circuit 130 from outside the oscillator 10 in the memory 160. The memory interface 131 may read information stored in the memory 160, and the interface circuit 130 may transmit the information to the outside of the oscillator 10.

According to the present embodiment, the user can write various programs in the memory 160 via the memory interface 131, and various kinds of signal processing using the time difference information TMD can be realized by the programs. An example of signal processing using the time difference information TMD is as described above with reference to FIGS. 5 and 6. By incorporating the processing circuit 150 in the circuit device 100, it is not necessary to provide a processing device for performing signal processing using the time difference information TMD outside the oscillator 10. That is, various kinds of signal processing using the time difference information TMD can be realized by the oscillator 10 alone.

In FIG. 11, although the circuit device 100 includes the frequency division circuits 141 and 142, one or both of the frequency division circuits 141 and 142 may be omitted. The fourth and fifth configuration examples may be combined. That is, the circuit device 100 of FIG. 11 may include the temperature sensor 170 and the temperature compensation circuit 180 of FIG. 10. In this case, the temperature compensation circuit 180 may be included in the processing circuit 150. That is, the function of the temperature compensation circuit 180 may be realized as a part of processing executed by the processing circuit 150.

6. Time-to-Digital Conversion Circuit

A detailed configuration example of the time-to-digital conversion circuit 120 will be described with reference to FIGS. 12 to 15. In FIGS. 12 to 15, STA is the first signal and STP is the second signal.

Figure 12:
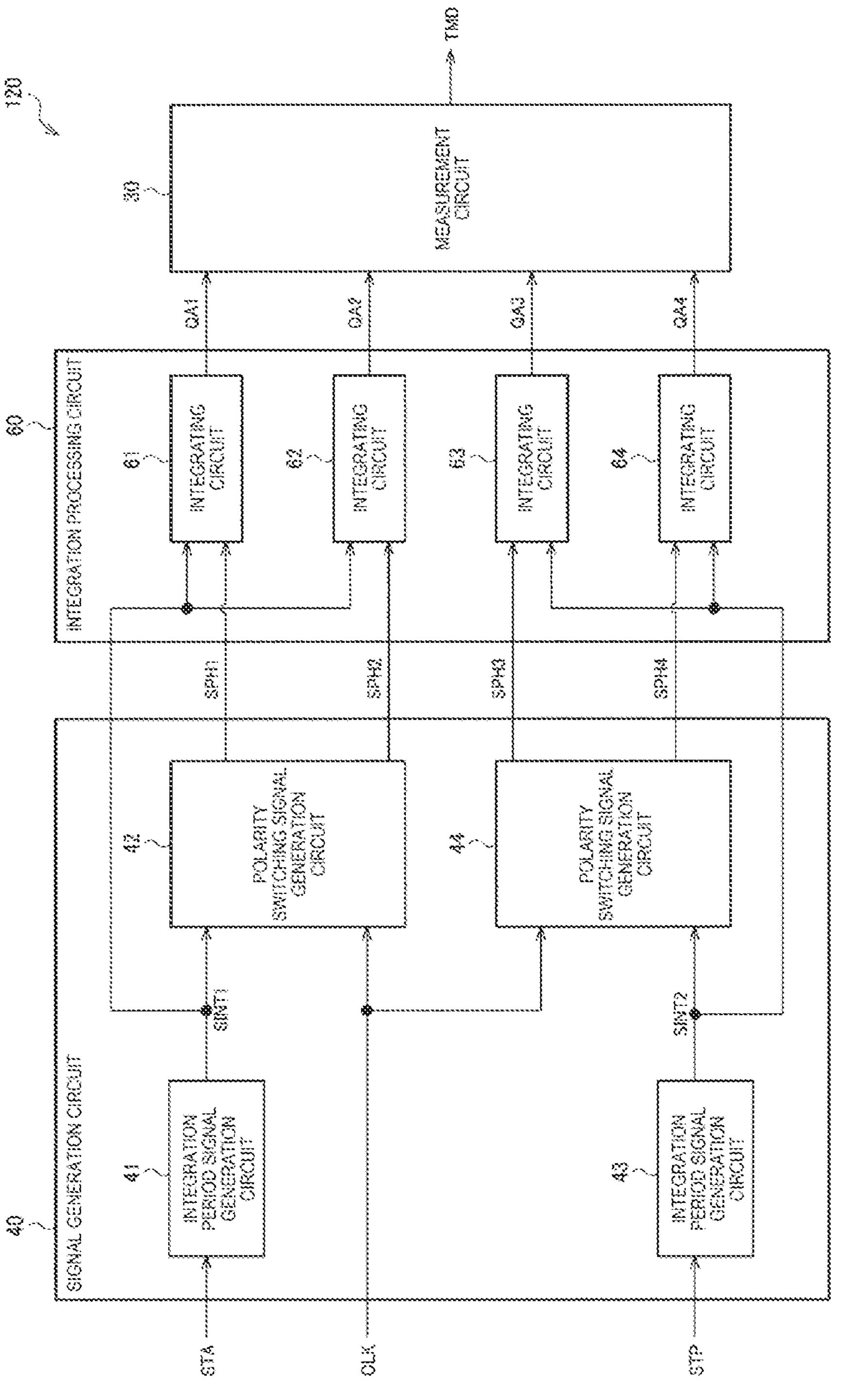
FIG. 12 illustrates a first detailed configuration example of the time-to-digital conversion circuit.

FIG. 12 illustrates a first detailed configuration example of the time-to-digital conversion circuit 120. The time-to-digital conversion circuit 120 includes a measurement circuit 30, a signal generation circuit 40, and an integration processing circuit 60. Here, a second signal STP is assumed to be a signal having a frequency lower than that of the clock signal CLK. For example, the second signal STP is the frequency divided clock signal CKG.

The signal generation circuit 40 generates a signal for integration processing based on the first signal STA, the second signal STP, and the clock signal CLK. In the first detailed configuration example, the clock signal CLK is used as the reference clock signal that serves as a reference for time measurement. The signal generation circuit 40 includes integration period signal generation circuits 41 and 43 and polarity switching signal generation circuits 42 and 44.

The integration period signal generation circuit 41 generates a signal SINT1 based on the first signal STA. The polarity switching signal generation circuit 42 generates signals SPH1 and SPH2 based on the signal SINT1 and the clock signal CLK. The integration period signal generation circuit 43 generates a signal SINT2 based on the second signal STP. The polarity switching signal generation circuit 44 generates signals SPH3 and SPH4 based on the signal SINT2 and the clock signal CLK. The signals SINT1 and SINT2 are integration period signals, and the signals SPH1, SPH2, SPH3, and SPH4 are integration polarity switching signals.

The integration processing circuit 60 performs integration processing based on the signals SINT1, SPH1, SPH2, SINT2, SPH3, and SPH4 to output voltages QA1 to QA4 that are the first to fourth integration values. The voltages QA1 and QA2 indicate phases corresponding to the time difference between the transition timings of the first signal STA and the clock signal CLK. The voltages QA3 and QA4 indicate phases corresponding to the time difference between the transition timings of the second signal STP and the clock signal CLK. The integration processing circuit 60 includes integrating circuits 61 to 64.

The integrating circuit 61 performs first integration processing based on the signals SINT1 and SPH1. The integrating circuit 62 performs second integration processing based on the signals SINT1 and SPH2. The integrating circuit 63 performs third integration processing based on the signals SINT2 and SPH3. The integrating circuit 64 performs fourth integration processing based on the signals SINT2 and SPH4.

The measurement circuit 30 performs A/D conversion on each of the voltages QA1 to QA4 that are the results of the first to fourth integration processing, and performs an arithmetic operation on the time difference information TMD from the A/D converted value. The time difference information TMD indicates the time difference between the transition timings of the first signal STA and the second signal STP.

Figure 13:
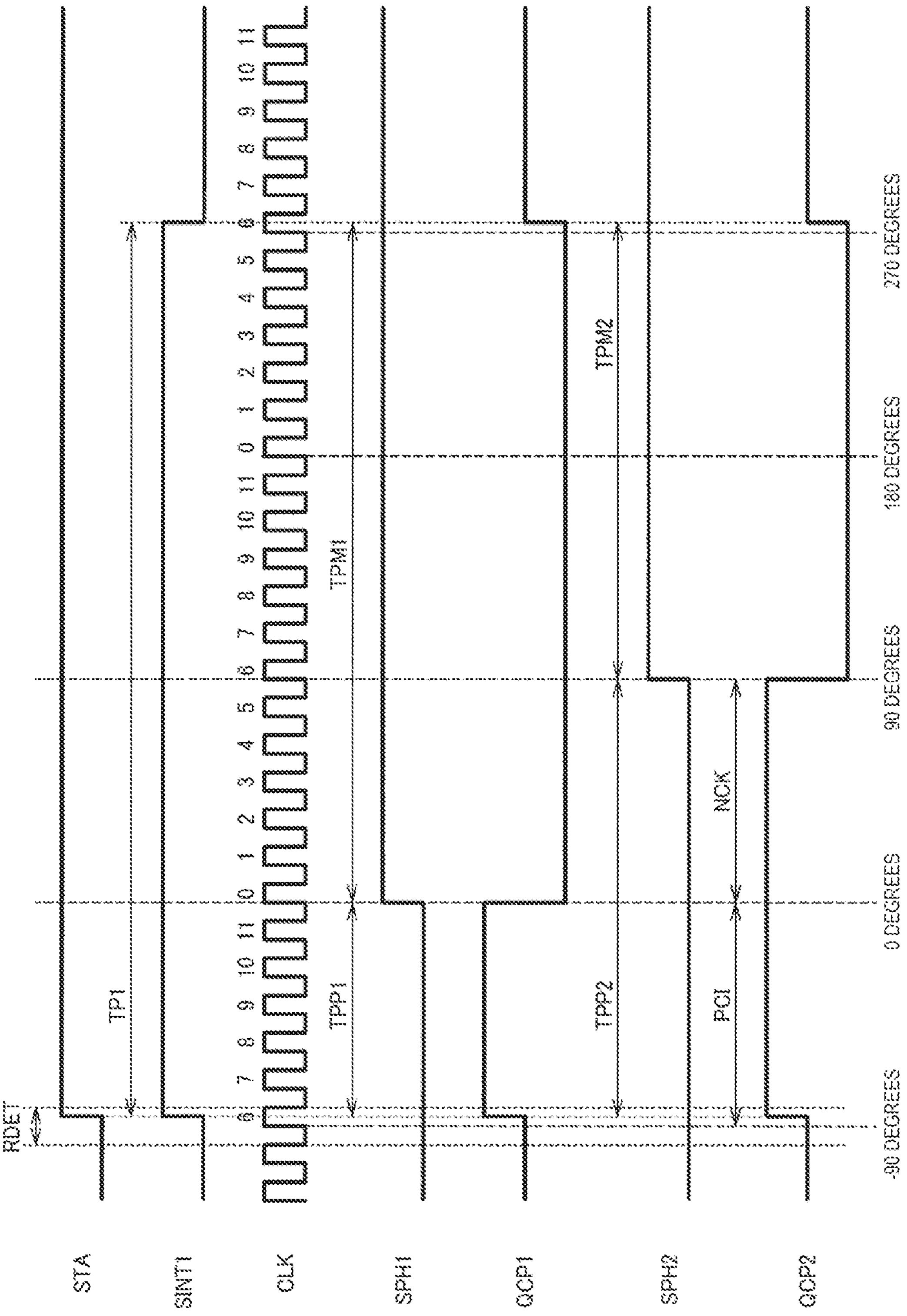
FIG. 13 illustrates a waveform diagram for illustrating an operation of the first detailed configuration example of the time-to-digital conversion circuit.

FIG. 13 illustrates a waveform diagram illustrating an operation of the first detailed configuration example of the time-to-digital conversion circuit 120. Here, an operation of obtaining the voltages QA1 and QA2 indicating the phase of the first signal STA will be described as an example.

The integration period signal generation circuit 41 makes the signal SINT1 transition from the low level to the high level at the transition timing of the first signal STA, holds the signal SINT1 at the high level in the integration period TP1, and then sets the signal SINT1 to the low level. The length of the integration period TP1 may be four times or more the cycle of the clock signal CLK, and need not be an integer multiple of the cycle of the clock signal CLK.

A phase detection range RDET of the first signal STA corresponds to one cycle of the clock signal CLK. When the first signal STA makes a transition, the cycle of the clock signal CLK to which the transition timing belongs becomes the detection range RDET.

The polarity switching signal generation circuit 42 makes the signal SPH1 transition from a low level to a high level at a timing synchronized with the clock signal CLK in an integration period TP1. The transition timing of the signal SPH1 is synchronized with a rising edge after the number of clocks PCI from the rising edge of the clock signal CLK in the detection range RDET. The number of clocks PCI may be set randomly. In FIG. 13, PCI=6.

It is assumed that the transition timing of the signal SPH1 is regarded as a phase reference, that is, 0 degree. This corresponds to assuming that the phase of the first signal STA is 0 degree when the transition timing of the first signal STA coincides with the rising edge of the clock signal CLK. In FIG. 13, the length of the integration period TP1 corresponds to 24 cycles of the clock signal CLK. When this integration period TP1 is regarded as a phase of 360 degrees, one cycle of the clock signal CLK corresponds to a phase of 15 degrees. Each pulse of the clock signal CLK in FIG. 13 is numbered with the transition timing of the signal SPH1 as a reference "0", and if the number differs by 1, the phase differs by 15 degrees.

In the integration period TP1, the polarity switching signal generation circuit 42 makes the signal SPH2 transition from the low level to the high level after number of clocks NCK of the clock signal CLK from the transition timing of the signal SPH1. In FIG. 13, NCK=6, and the phases of the signal SPH1 and the signal SPH2 differ by 90 degrees. This is equivalent to obtaining two integrated values with a 90 degree phase shift.

The integration period TP1 is divided into a period TPP1 and a period TPM1 according to the transition timing of the signal SPH1. The integrating circuit 61 performs first integration processing with first polarity in the period TPP1 and the first integration processing with second polarity which is the reverse polarity of the first polarity in the period TPM1. In FIG. 13, the first polarity is positive polarity and the second polarity is negative polarity. The integrating circuit 61 outputs the voltage QA1 as an integration result.

The integration period TP1 is divided into a period TPP2 and a period TPM2 according to the transition timing of the signal SPH2. The integrating circuit 62 performs second integration processing with the first polarity in the period TPP2 and the second integration processing with the second polarity in the period TPM2. The integrating circuit 62 outputs the voltage QA2 as the integration result.

Thus, the operation of obtaining the voltages QA1 and QA2 indicating the phase of the first signal STA is described as above, but the voltages QA3 and QA4 indicating the phase of the second signal STP can also be obtained by the similar operation.

It is assumed that TDF is the time difference between the transition timings of the first signal STA and the second signal STP. The measurement circuit 30 obtains the time difference TDF by TDF=TC×(QA3/AZ2−QA1/AZ1). TC is the cycle of the clock signal CLK, AZ1=QA2−QA1, and AZ2=QA4−QA3. AZ1 and AZ2 are constant regardless of the value of the time difference TDF. In FIG. 13, the integration period TP1 is an unknown number, and an offset due to this unknown number occurs in QA1/AZ1 and QA3/AZ2. However, since the integration period TP1 for obtaining QA1 and QA3 is common, an offset of QA1/AZ1 and an offset of QA3/AZ2 have the same value and are canceled by subtraction.

Figure 14:
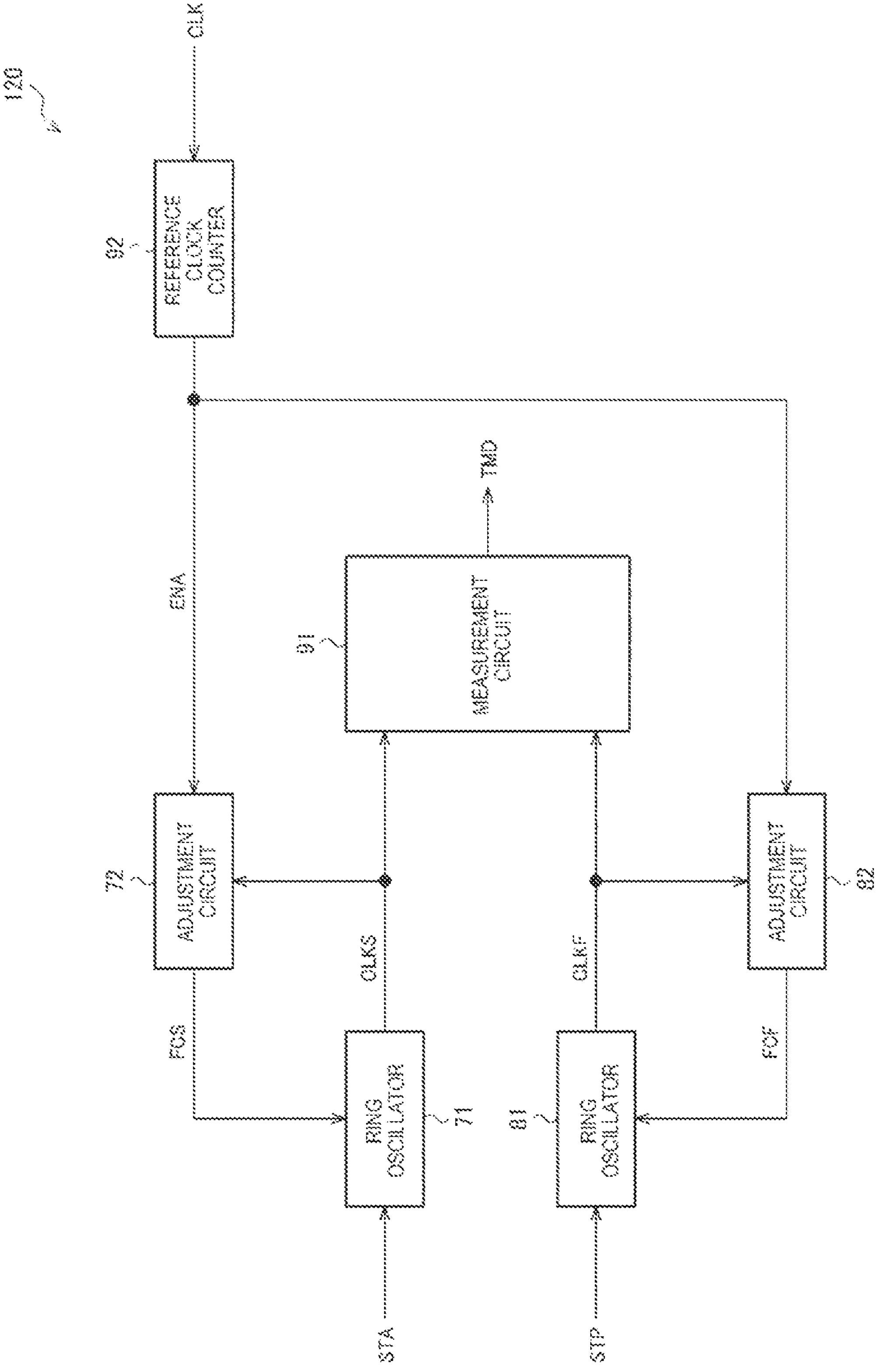
FIG. 14 illustrates a second detailed configuration example of the time-to-digital conversion circuit.

FIG. 14 illustrates a second detailed configuration example of the time-to-digital conversion circuit 120. The time-to-digital conversion circuit 120 includes ring oscillators 71 and 81, a measurement circuit 91, a reference clock counter 92, and adjustment circuits 72 and 82.

In the second configuration example, the time-to-digital conversion circuit 120 has a measurement mode and an adjustment mode. The measurement mode is a mode for measuring the time difference, and the adjustment mode is a mode for adjusting oscillation frequencies of the ring oscillators 71 and 81.

First, the measurement mode will be described. In the ring oscillator 71, an oscillation loop is enabled at the transition timing of the first signal STA. With this configuration, the ring oscillator 71 starts oscillating and generates a clock signal CLKS. In the ring oscillator 81, the oscillation loop is enabled at the transition timing of the second signal STP. With this configuration, the ring oscillator 81 starts oscillating and generates a clock signal CLKF. The frequency of the clock signal CLKS is f1 and the frequency of the clock signal CLKF is f2. f2 is higher than f1.

The measurement circuit 91 obtains the time difference information TMD based on the clock signal CLKS and the clock signal CLKF. The time difference information TMD indicates the time difference between the transition timings of the first signal STA and the second signal STP. A method for obtaining the time difference information TMD will be described later with reference to FIG. 15.

Next, the adjustment mode will be described. In the second detailed configuration example, the clock signal CLK is used as a reference clock signal that serves as a reference for the oscillation frequencies of the ring oscillators 71 and 81. The reference clock counter 92 counts the number of clocks of the clock signal CLK, and outputs an enable signal ENA that becomes active during a period of counting a given number of clocks.

The adjustment circuit 72 counts the number of clocks of the clock signal CLKS during the period when the enable signal ENA is active. The adjustment circuit 72 integrates the difference between the count value and a first target value, and outputs control data FCS obtained by the integration. The first target value is a value for setting the oscillation frequency of the ring oscillator 71. The ring oscillator 71 oscillates at an oscillation frequency according to the control data FCS. For example, a variable capacitance circuit is provided as a load of the oscillation loop of the ring oscillator 71, and the capacitance value of the variable capacitance circuit is controlled by the control data FCS. In this way, the oscillation frequency of the ring oscillator 71 is adjusted.

The adjustment circuit 82 counts the number of clocks of the clock signal CLKF during the period when the enable signal ENA is active. The adjustment circuit 82 integrates the difference between the count value and a second target value, and outputs control data FCF obtained by the integration. The second target value is a value for setting the oscillation frequency of the ring oscillator 81. The ring oscillator 81 oscillates at an oscillation frequency according to the control data FCF. For example, a variable capacitance circuit is provided as a load of the oscillation loop of the ring oscillator 81, and the capacitance value of the variable capacitance circuit is controlled by the control data FCF. In this way, the oscillation frequency of the ring oscillator 81 is adjusted.

When the time-to-digital conversion circuit 120 is set to the measurement mode after the adjustment mode, the control data FCS and FCF obtained in the adjustment mode are input to the ring oscillators 71 and 81. With this configuration, the ring oscillators 71 and 81 oscillate at the oscillation frequency adjusted in the adjustment mode, and the measurement circuit 91 can measure the time using the clock signals CLKS and CLKF having accurate frequencies.

Figure 15:
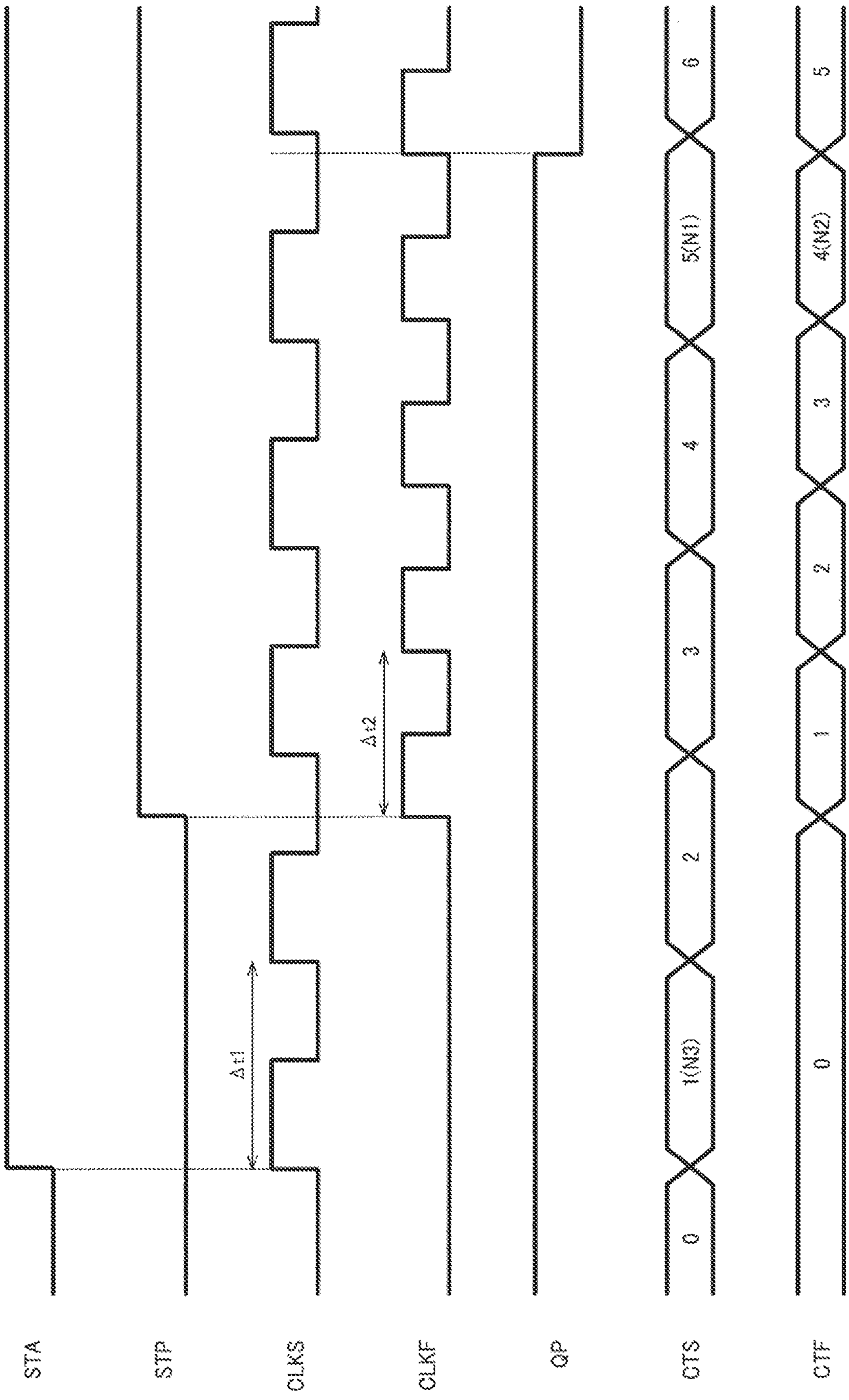
FIG. 15 illustrates a waveform diagram for illustrating an operation of the second detailed configuration example of the time-to-digital conversion circuit.

FIG. 15 illustrates a waveform diagram illustrating an operation of the second detailed configuration example of the time-to-digital conversion circuit 120. FIG. 15 illustrates a waveform diagram in the measurement mode.

The measurement circuit 91 compares the phases of the clock signal CLKS and the clock signal CLKF, and brings a phase comparison result signal QP from the high level to the low level when it is determined that the phase of the clock signal CLKS and the phase of the clock signal CLKF are switched. The phase comparison result signal QP is an internal signal of the measurement circuit 91.

The measurement circuit 91 counts the number of clocks of the clock signal CLKS. This count value is CTS. The measurement circuit 91 also counts the number of clocks of the clock signal CLKF. This count value is CTF.

The measurement circuit 91 acquires the count values CTS and CTF at the falling edge of the phase comparison result signal QP. The count values are N1 and N2. When the cycle of the clock signal CLKS is $\Delta t1=1/f1$ and the cycle of the clock signal CLKF is $\Delta t2=1/f2$, the difference between the cycles is resolution $\Delta t=|\Delta t1-\Delta t2|$. When $N3=N1-N2$, the measurement circuit 91 obtains the time difference between the transition timings of the first signal STA and the second signal STP by $N3\times\Delta t1+N2\times\Delta t$. In FIG. 15, since $N1=5$, $N2=4$, and $N3=1$, the time difference is $\Delta t1+4\times\Delta t$.

7. Sixth Configuration Example

Figure 16:
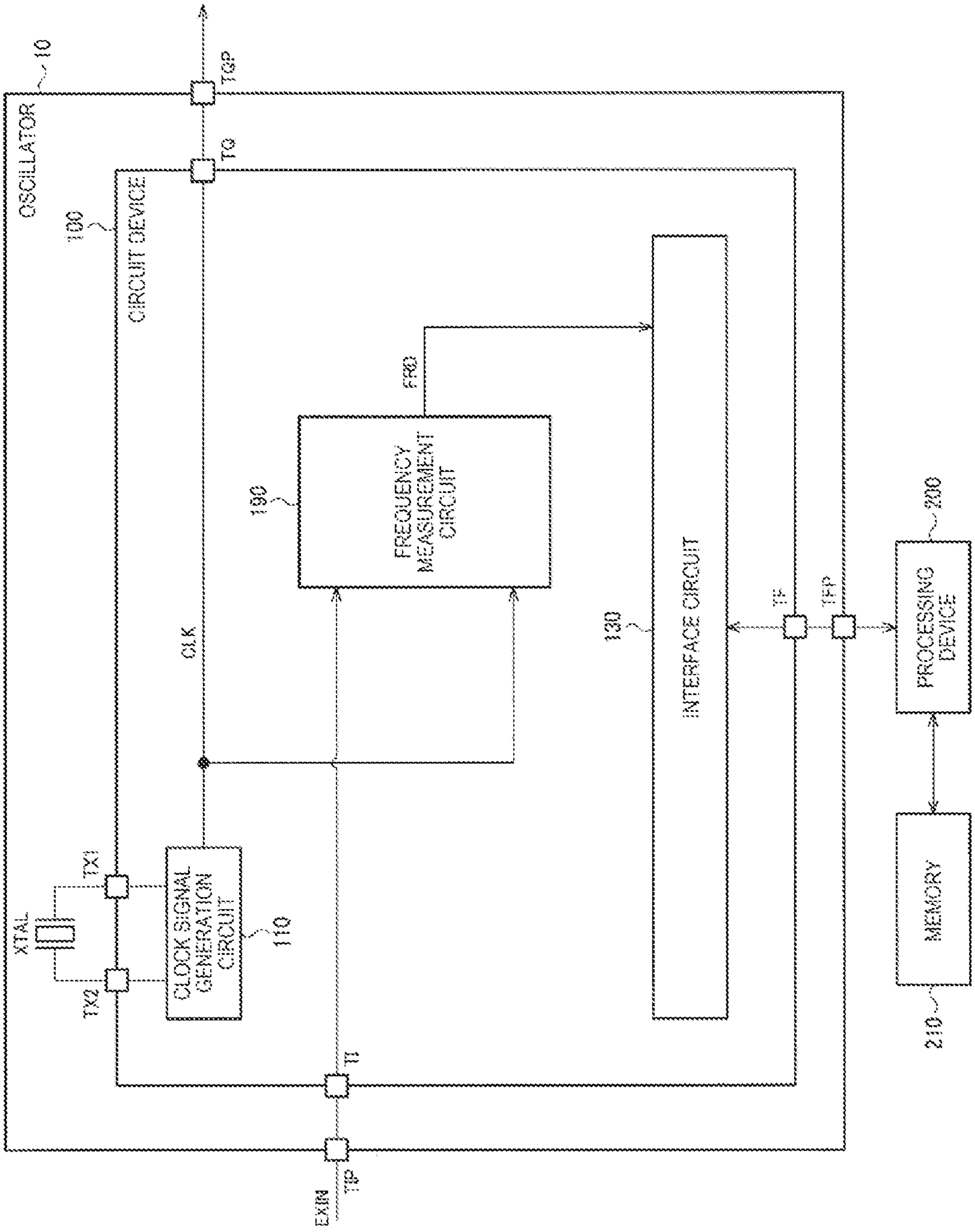
FIG. 16 illustrates another configuration example of the oscillator and a sixth configuration example of the circuit device.

FIG. 16 illustrates another configuration example of the oscillator 10 and a sixth configuration example of the circuit device 100. The same components as those already described are designated by the same reference numerals and the description of the components will be appropriately omitted.

The circuit device 100 generates the clock signal CLK using the resonator XTAL and measures, based on one of the external clock signal EXIN input from outside the oscillator 10 and the clock signal CLK, the frequency of the other one. The circuit device 100 is an integrated circuit device called an integrated circuit (IC). The circuit device 100 is an IC manufactured by a semiconductor process, and is a semiconductor chip in which circuit elements are formed on a semiconductor substrate.

The circuit device 100 includes the clock signal generation circuit 110, a frequency measurement circuit 190, the interface circuit 130, and the terminals TX1, TX2, TI, TQ, and TF.

The external clock signal EXIN is input to the terminal TIP from outside the oscillator 10. The external clock signal EXIN is a signal that periodically makes a transition between the first voltage level and the second voltage level. As the external clock signal EXIN, for example, a clock signal input from an external clock source or a time signal input from a GNSS receiver or a network receiver can be assumed.

The external clock signal EXIN is input to the frequency measurement circuit 190 from the terminal TIP via the terminal TI, and the clock signal CLK is input to the frequency measurement circuit 190 from the clock signal generation circuit 110. One of the clock signal CLK and the external clock signal EXIN is used as the first clock signal, and the other of the clock signal CLK and the external clock signal EXIN is used as the second clock signal. The frequency measurement circuit 190 obtains frequency information FRD corresponding to the frequency of the first clock signal by measuring the frequency of the first clock signal based on the frequency of the second clock signal. The frequency information FRD is information indicating a frequency, and is specifically a digital value in which the frequency is encoded. The frequency information FRD is a frequency of the first clock signal relative to a frequency of the second clock signal that serves as a reference, and is, for example, a ratio of the frequency of the first clock signal to the frequency of the second clock signal.

In the following, a case where the first clock signal is the external clock signal EXIN and the second clock signal is the clock signal CLK will be described as an example. That is, in the following description, the external clock signal EXIN can be read as the first clock signal and the clock signal CLK can be read as the second clock signal.

The interface circuit 130 transmits the frequency information FRD from the frequency measurement circuit 190 to the processing device 200. An example of signal processing using the frequency information FRD will be described later with reference to FIGS. 21 to 23.

As the configuration of the clock signal generation circuit 110, the configuration of FIG. 8 or 9 can be used. When the configuration of FIG. 8 is adopted, temperature compensation data is input to the D/A conversion circuit 112 instead of the frequency adjustment data FAD. With this configuration, the oscillation circuit 111 adjusts the frequency of the clock signal CLK based on the temperature compensation data. When the configuration of FIG. 9 is adopted, the temperature compensation data is input to the frequency division ratio setting circuit FPE instead of the frequency adjustment data FAD. With this configuration, the fractional-N PLL circuit 116 adjusts the frequency of the clock signal CLK by adjusting the frequency division ratio of the feedback loop based on the temperature compensation data.

According to the present embodiment, the clock signal CLK generated by the oscillator 10 is output to the outside, and the frequency of the external clock signal EXIN input to the oscillator 10 from the outside is measured based on the frequency of the clock signal CLK, and the frequency information FRD indicating the frequency of the external clock signal EXIN is obtained. With this configuration, various kinds of signal processing using the frequency information FRD can be realized. For example, as described later with reference to FIGS. 21 to 23, a frequency synchronization system that generates a clock signal CLK having the same frequency as the external clock signal EXIN, an FLL that generates a clock signal CLK having a frequency obtained by multiplying the frequency of the external clock signal EXIN, an abnormality detection system that detects an abnormality in the external clock signal EXIN or the clock signal CLK or the like can be configured. FLL is an abbreviation for Frequency Locked Loop.

For example, a synchronization system such as the FLL using a frequency measurement circuit of the related art is known, but the synchronization system cannot be used for purposes other than the FLL because the synchronization system is configured as the FLL, as a matter of course. Even in the case of FLL, control algorithm such as a feedback loop is limited to the algorithm implemented in the product, and it is difficult for the user to use a unique function or control algorithm. That is, the FLL of the related art has limited customizability. In this respect, the oscillator 10 of the present embodiment can be used not only for the FLL but also for various purposes, and the function and control algorithm thereof can be freely customized by the user.

In the present embodiment, the interface circuit 130 outputs the frequency information FRD to the outside of the oscillator 10. With this configuration, the oscillator 10 and the outside thereof are interfaced with only the digital signals of the external clock signal EXIN, the clock signal CLK, and the frequency information FRD. That is, when a system such as the FLL using the oscillator 10 is configured, the oscillation circuit which is an analog part thereof is packaged as the oscillator 10. Even when the frequency measurement circuit 190 includes an analog circuit such as the time-to-digital conversion circuit, the frequency measurement circuit 190 is packaged as the oscillator 10 together with the oscillation circuit. Therefore, only a digital processing circuit such as a processor may be used outside the oscillator 10. With this configuration, the user may develop algorithms for digital processing without incurring a design burden of the analog part of the system. That is, by using the oscillator 10 of the present embodiment, system development such as a synchronization system is simplified.

In the present embodiment, the clock signal generation circuit 110, the frequency measurement circuit 190, and the interface circuit 130 are provided in one semiconductor substrate. With this configuration, as compared with the case where the clock signal generation circuit 110 and the frequency measurement circuit 190 are configured as separate ICs, a delay or waveform deformation of a signal to be measured can be suppressed, and thus the frequency measurement circuit 190 can measure an accurate frequency.

8. Frequency Measurement Circuit

Figure 17:
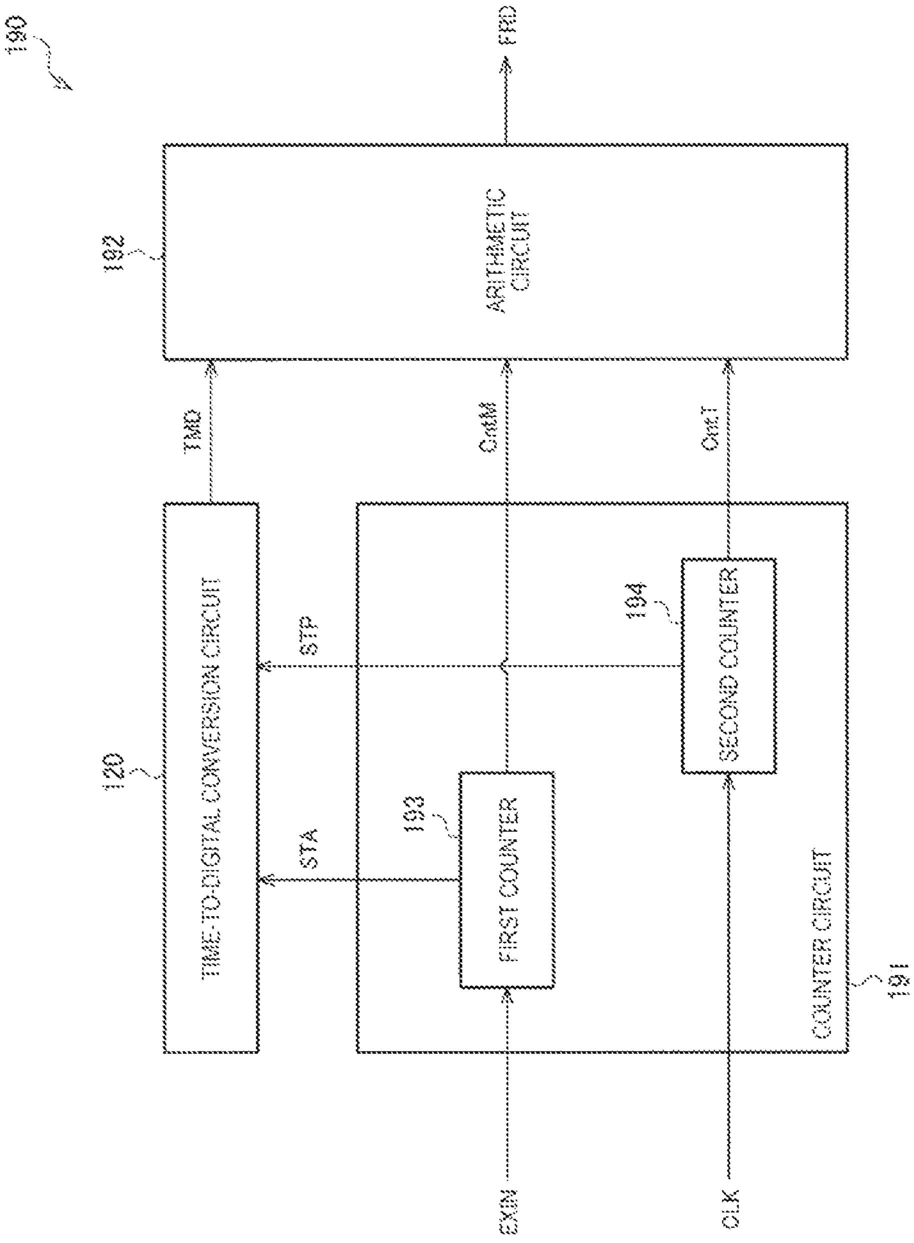
FIG. 17 illustrates a detailed configuration example of a frequency measurement circuit.

FIG. 17 illustrates a detailed configuration example of the frequency measurement circuit 190. The frequency measurement circuit 190 includes the time-to-digital conversion circuit 120, a counter circuit 191, and an arithmetic circuit 192.

The time-to-digital conversion circuit 120 measures the time difference between the transition timing of the first signal STA based on the external clock signal EXIN and the transition timing of the second signal STP based on the clock signal CLK, and obtains the time difference information TMD corresponding to the time difference. The transition timing is a timing at which a voltage level of a signal changes, and is a rising edge or a falling edge of the signal. The first signal is a signal whose transition timing is determined according to the transition timing of the external clock signal EXIN. The second signal is a signal whose transition timing is determined according to the transition timing of the clock signal CLK. The first signal STA and the second signal STP are input from the counter circuit 191 to the time-to-digital conversion circuit 120. Details of the first signal STA and the second signal STP will be described later. The detailed configuration of the time-to-digital conversion circuit 120 is as described with reference to FIGS. 12 to 15.

The counter circuit 191 performs count processing based on the external clock signal EXIN and the clock signal CLK, and outputs count data CntM and CntT obtained by the count processing. Specifically, the counter circuit 191 includes a first counter 193 and a second counter 194. The first counter 193 performs count processing based on the external clock signal EXIN and outputs the count data CntM. The second counter 194 performs count processing based on the clock signal CLK and outputs the count data CntT.

The arithmetic circuit 192 obtains the frequency information FRD by performing an arithmetic operation based on the time difference information TMD and the count data CntM and CntT. The count data CntM corresponds to the time whose resolution is the cycle of the external clock signal EXIN, and the count data CntT corresponds to the time whose resolution is the cycle of the clock signal CLK. In addition to the pieces of count data, the arithmetic circuit 192 can accurately determine the cycle of the external clock signal EXIN with the cycle of the clock signal CLK as a reference by using the time difference information TMD measured with a time resolution smaller than the clock cycle. The frequency can be obtained by the reciprocal of the cycle.

Figure 18:
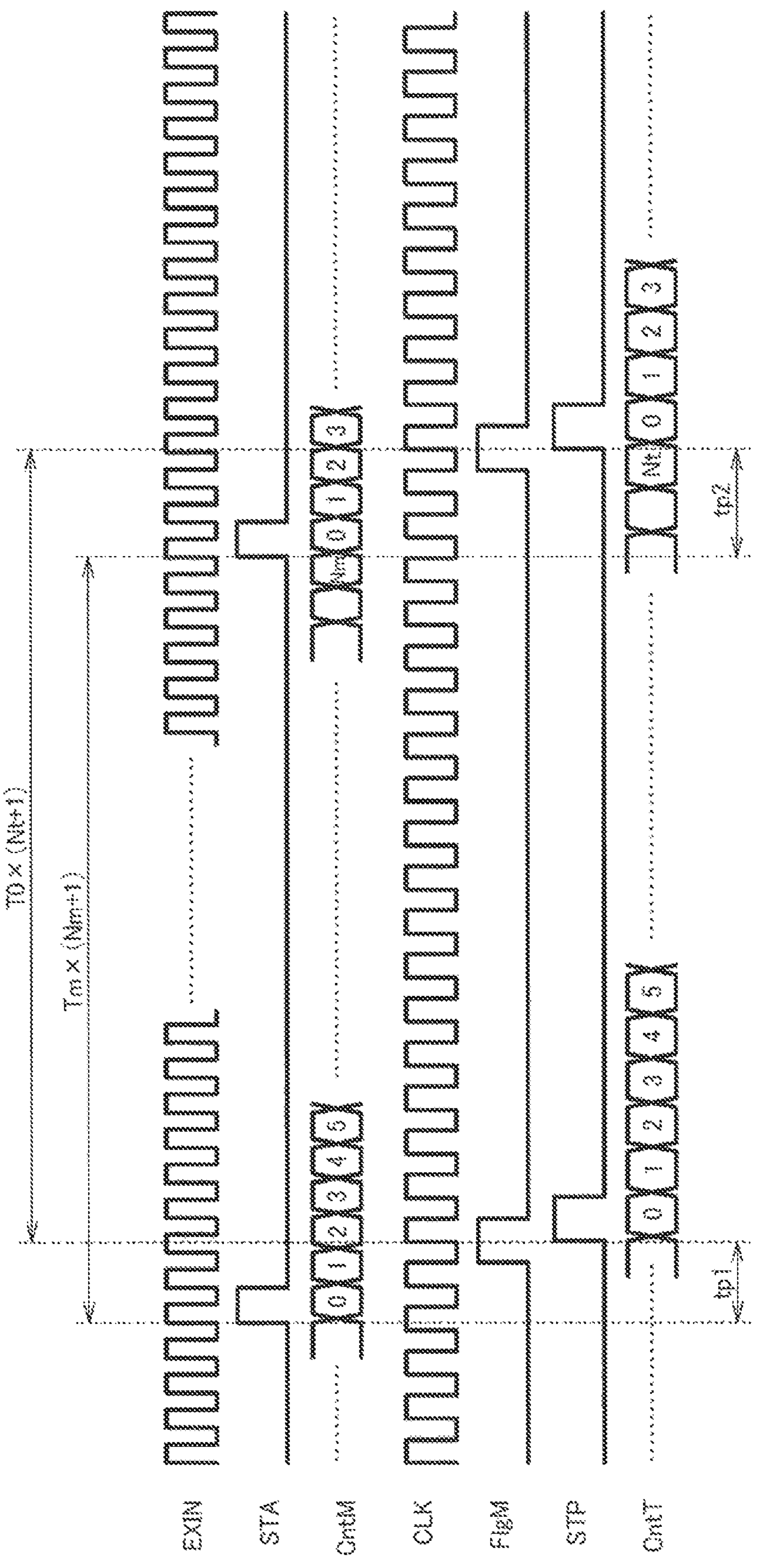
FIG. 18 illustrates a waveform diagram for illustrating an operation of the frequency measurement circuit.

FIG. 18 is a waveform diagram illustrating the operation of the frequency measurement circuit 190. FIG. 18 illustrates a case where the first signal STA is a start signal and the second signal STP is a stop signal. Here, the transition timing is the timing at the rising edge.

The first counter 193 counts the number of pulses of the external clock signal EXIN, and makes the first signal STA transition at Nm+1 counting cycle. The first counter 193 outputs a count value Nm as the count data CntM. Nm is a predetermined count value, which may be set in advance or may be set by register setting, for example.

Specifically, the first counter 193 resets the count value to 0 and makes the first signal STA transition from the low level to the high level at the transition timing of the external clock signal EXIN. The first counter 193 counts the number of pulses of the external clock signal EXIN up to the count value Nm, resets the count value to 0 again at the transition timing of the external clock signal EXIN, and makes the first signal STA transition from the low level to the high level. The first signal STA is at the high level for one cycle of the external clock signal EXIN, for example, but the number of cycles may be any number.

The second counter 194 makes the second signal STP transition at the transition timing of the clock signal CLK after the first signal STA makes a transition. The second counter 194 counts the number of pulses of the clock signal CLK in the period from when the second signal STP makes a transition to when the next second signal STP makes a transition, and outputs a count value Nt as the count data CntT.

Specifically, the second counter 194 makes a signal FlgM transition from the low level to the high level at the second falling edge of the clock signal CLK after the first signal STA makes a transition from the low level to the high level, and makes the signal FlgM transition from the high level to the low level at the next falling edge of the clock signal CLK. The signal FlgM is an internal signal of the second counter 194. The second counter 194 makes the second signal STP transition from the low level to the high level at the rising edge of the clock signal CLK when the signal FlgM is at the high level.

The second counter 194 resets the count value to 0 at the timing of making the second signal STP transition from the low level to the high level. The second counter 194 counts the number of pulses of the clock signal CLK until the timing at which the second signal STP is made transition to the high level next, and outputs the count value Nt at that time as the count data CntT.

The time-to-digital conversion circuit 120 measures the time difference between the transition timing of the first signal STA and the transition timing of the second signal. Since the first signal STA makes a transition periodically, the time difference is measured corresponding to each transition timing thereof. The time differences in this time series are tp1 and tp2. The time-to-digital conversion circuit 120 outputs the time difference information TMD indicating the time differences tp1 and tp2.

The arithmetic circuit 192 obtains a frequency fm of the external clock signal EXIN by the following expressions (1) and (2). T0 is a cycle of the clock signal CLK and is a known value. Tm is a cycle of the external clock signal EXIN, and the reciprocal of the cycle is the frequency fm.

$$Tm = \frac{T0(Nt+1)+(tp1-tp2)}{Nm+1} \tag{1}$$

$$fm = \frac{1}{Tm} \tag{2}$$

According to the present embodiment, the counter circuit 191 measures the cycle Tm of the external clock signal EXIN with the cycle T0 of the clock signal CLK as a reference, and the time-to-digital conversion circuit 120 further measures the time differences tp1 and tp2 with a resolution smaller than the cycle T0. With this configuration, the arithmetic circuit 192 can perform an arithmetic operation on the cycle Tm of the external clock signal EXIN with a resolution smaller than the cycle T0, and can obtain the accurate frequency fm of the external clock signal EXIN.

In the description as above, the first signal STA is the start signal and the second signal STP is the stop signal, but the second signal STP may be the start signal and the first signal STA may be the stop signal. In this case, the second counter 194 counts the number of pulses of the clock signal CLK and makes the second signal STP transition at Nm+1 counting cycle. The first counter 193 makes the first signal STA transition at the transition timing of the external clock signal EXIN after the second signal STP makes a transition. The first counter 193 counts the number of pulses of the external clock signal EXIN in the period from when the first signal STA makes a transition to when the first signal STA makes a transition next. This count value is Nt'. It is assumed that the time differences between the second signal STP and the first signal STA measured by the time-to-digital conversion circuit 120 are tp1' and tp2'. The arithmetic circuit 192 obtains the frequency fm of the external clock signal EXIN based on the count values Nm and Nt', the cycle T0 of the clock signal CLK, and the time differences tp1' and tp2'.

9. Seventh Configuration Example and Eighth Configuration Example

Figure 19:
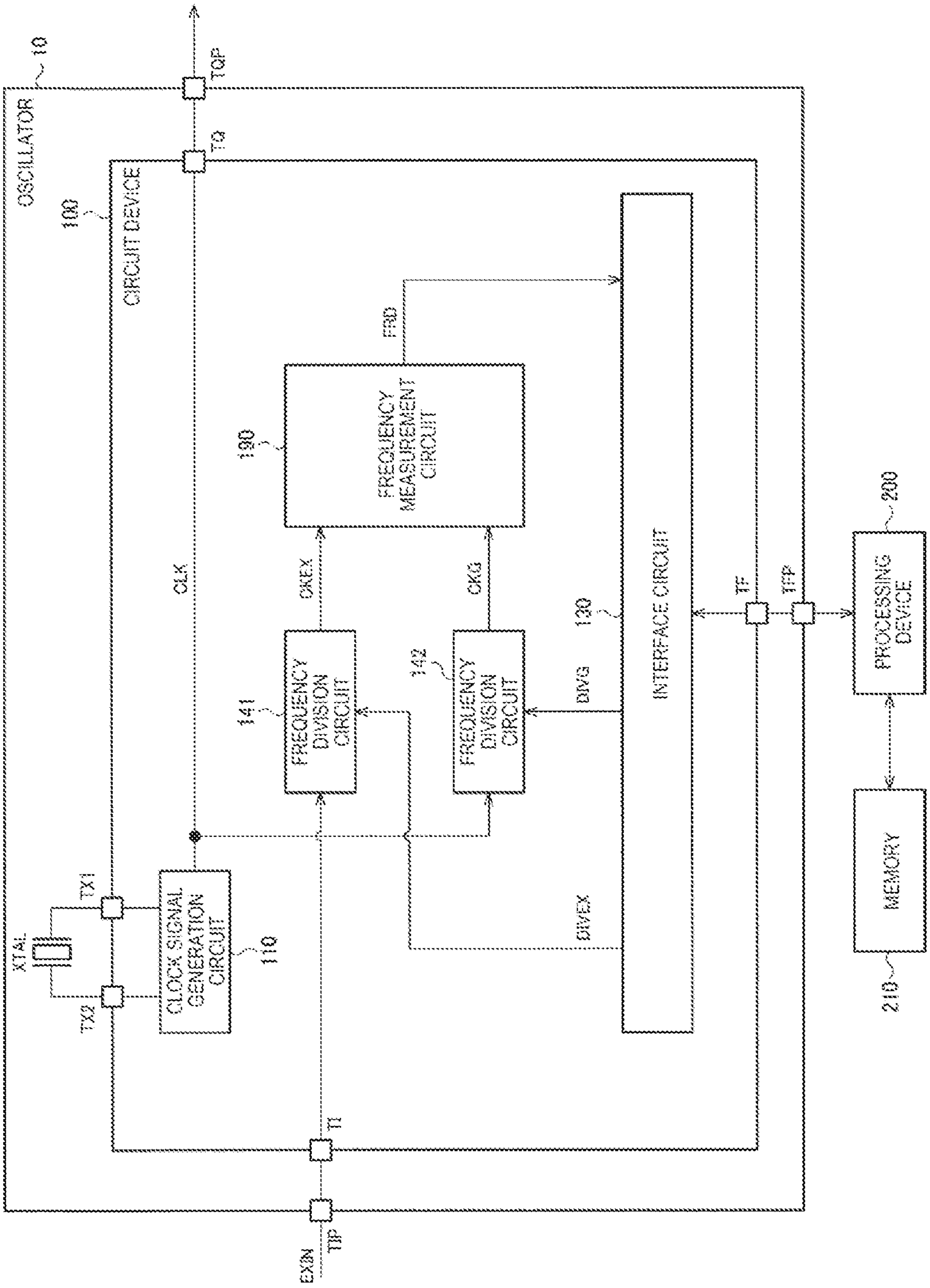
FIG. 19 illustrates a seventh configuration example of the circuit device.

FIG. 19 illustrates a seventh configuration example of the circuit device 100. In the seventh configuration example, the circuit device 100 further includes the frequency division circuit 141 that is a first frequency division circuit and the frequency division circuit 142 that is a second frequency division circuit. The same components as those already described are designated by the same reference numerals, and the description of the components will be appropriately omitted.

The interface circuit 130 receives the frequency division ratio setting information DIVEX for setting the first frequency division ratio, which is the frequency division ratio of the frequency division circuit 141, from the processing device 200, and outputs the frequency division ratio setting information DIVEX to the frequency division circuit 141. The interface circuit 130 receives the frequency division ratio setting information DIVG for setting the second frequency division ratio, which is the frequency division ratio of the frequency division circuit 142, from the processing device 200, and outputs the frequency division ratio setting information DIVG to the frequency division circuit 142.

The frequency division circuit 141 frequency-divides the external clock signal EXIN by the first frequency division ratio based on the frequency division ratio setting information DIVEX, and outputs the frequency divided clock signal CKEX obtained by the frequency division to the frequency measurement circuit 190. The frequency divided clock signal CKEX is a first frequency divided clock signal.

The frequency division circuit 142 frequency-divides the clock signal CLK by the second frequency division ratio based on the frequency division ratio setting information DIVG, and outputs the frequency divided clock signal CKG obtained by the frequency division to the frequency measurement circuit 190. The frequency divided clock signal CKG is a second frequency divided clock signal.

The frequency measurement circuit 190 obtains the frequency information FRD corresponding to the frequency of the external clock signal EXIN by measuring the frequency of the frequency divided clock signal CKEX based on the frequency of the frequency divided clock signal CKG. When the frequency measurement circuit 190 described in FIGS. 9 and 10 is applied to the fifth configuration example, the frequency divided clock signal CKEX is input to the frequency measurement circuit 190 instead of the external clock signal EXIN in FIGS. 9 and 10, and the frequency divided clock signal CKG is input to the frequency measurement circuit 190 instead of the clock signal CLK.

According to the present embodiment, the frequency division ratios of the frequency divided clock signals CKEX and CKG input to the frequency measurement circuit 190 can be randomly set by the frequency division ratio setting information DIVEX and DIVG. With this configuration, in the frequency measurement, it is possible to randomly select the frequency division ratio of the frequency divided clock signal CKG serving as a reference and the frequency division ratio of the frequency divided clock signal CKEX to be measured. For example, when a synchronization system using the oscillator 10 is configured, a frequency ratio between the external clock signal EXIN and the clock signal CLK can be set randomly.

Although the circuit device 100 includes both the frequency division circuits 141 and 142 in FIG. 19, the circuit device 100 may include only one of the frequency division circuits 141 and 142.

Figure 20:
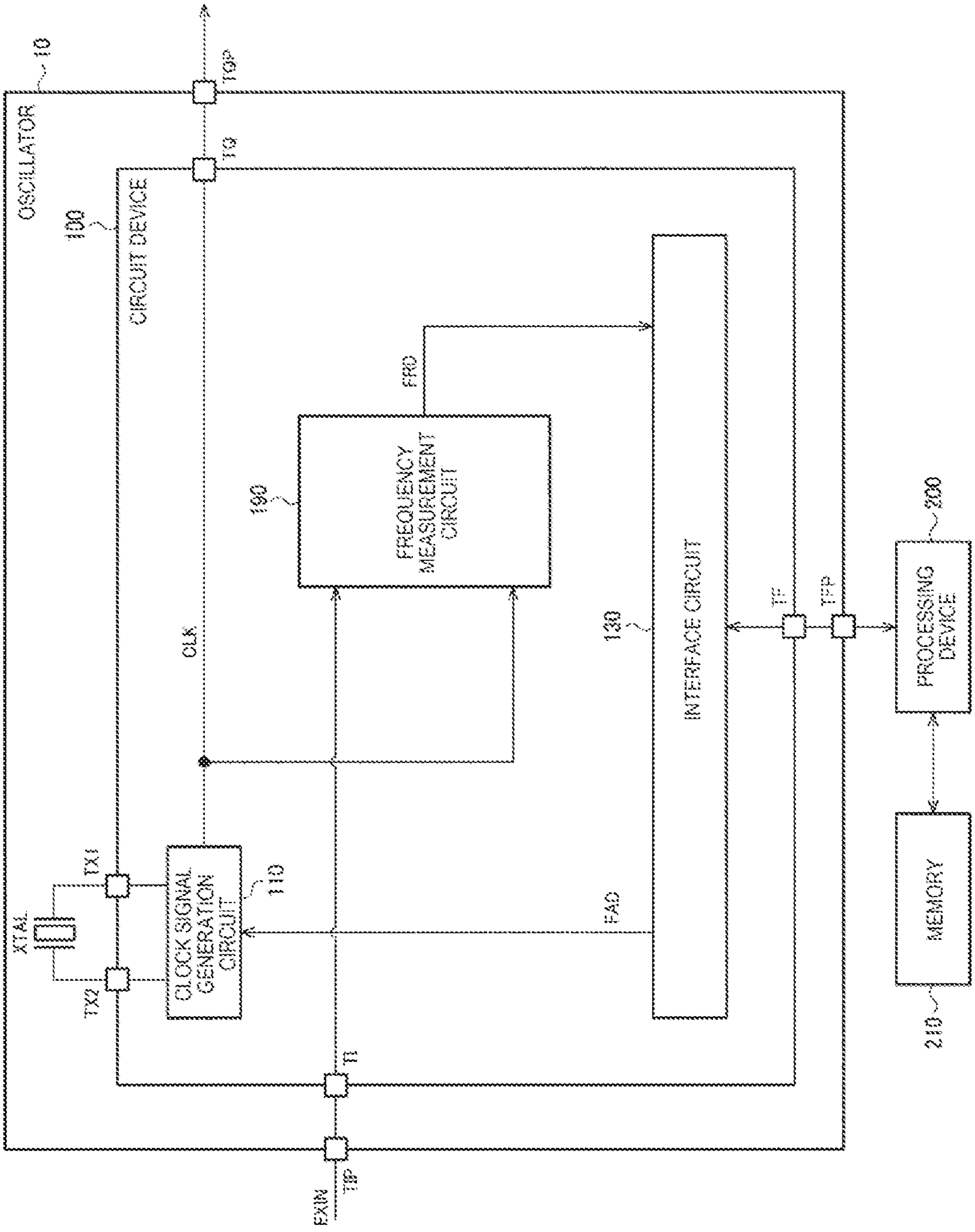
FIG. 20 illustrates an eighth configuration example of the circuit device.

FIG. 20 illustrates an eighth configuration example of the circuit device 100. The same components as those already described are designated by the same reference numerals, and the description of the components will be appropriately omitted.

In the eighth configuration example, the interface circuit 130 receives the frequency adjustment data FAD from the processing device 200 and outputs the frequency adjustment data FAD to the clock signal generation circuit 110. The clock signal generation circuit 110 adjusts the frequency of the clock signal CLK based on the frequency adjustment data FAD. Specifically, the clock signal generation circuit 110 generates the clock signal CLK having a frequency according to the frequency adjustment data FAD.

The frequency adjustment data FAD is data in which the frequency of the clock signal CLK changes when the value of the frequency adjustment data FAD changes, but the value of the frequency adjustment data FAD and the frequency of the clock signal CLK does not need to have a one-to-one correspondence. That is, the frequency of the clock signal CLK may change due to process variations, power supply voltage variations, or temperature variations, and thus the frequency of the clock signal CLK may change even if the frequency adjustment data FAD does not change.

According to the present embodiment, it becomes possible to adjust the frequency of the clock signal CLK output from the oscillator 10 by the frequency adjustment data FAD. For example, by using the frequency adjustment data FAD generated based on the frequency information FRD, it becomes possible to frequency-synchronize the clock signal CLK with the external clock signal EXIN.

The seventh and eighth configuration examples may be combined. That is, the circuit device 100 of FIG. 20 may further include the frequency division circuits 141 and 142 of FIG. 19, and the frequency divided clock signals CKEX and CKG may be input to the frequency measurement circuit 190 of FIG. 20.

10. System Configuration Example

Figure 21:
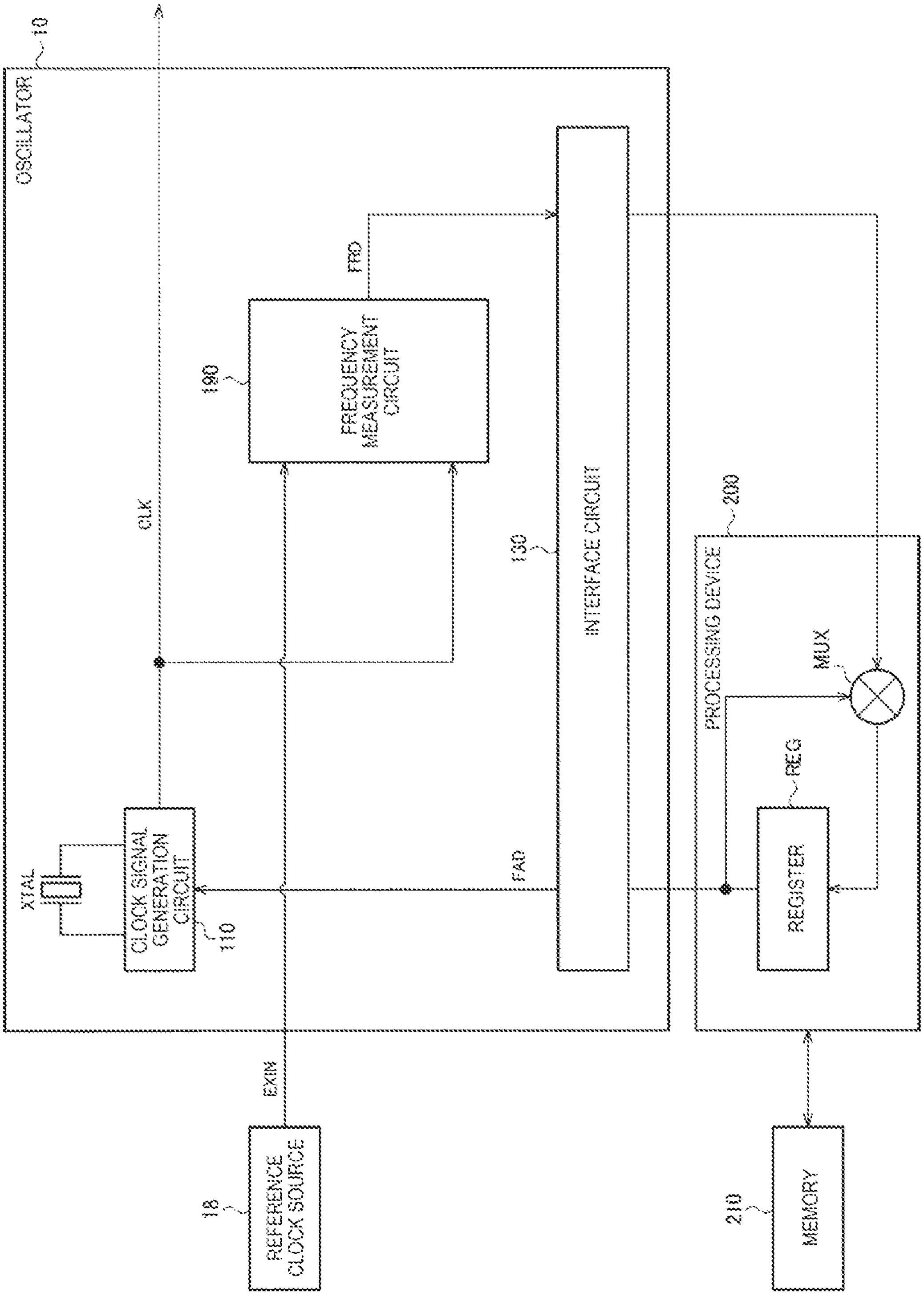
FIG. 21 illustrates a configuration example of a frequency synchronization system using the oscillator.
Figure 22:
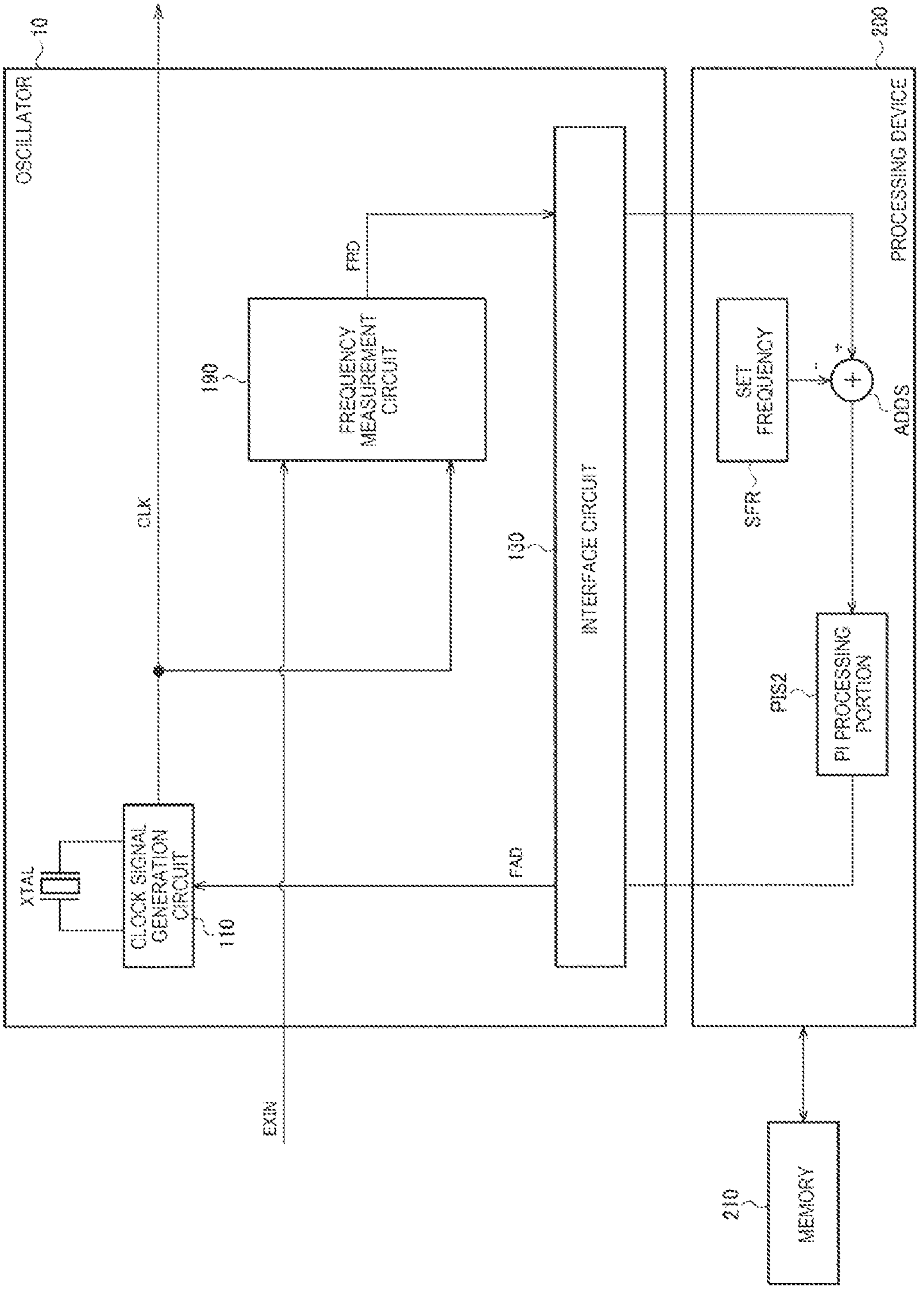
FIG. 22 illustrates a system configuration example of an FLL using the oscillator.
Figure 23:
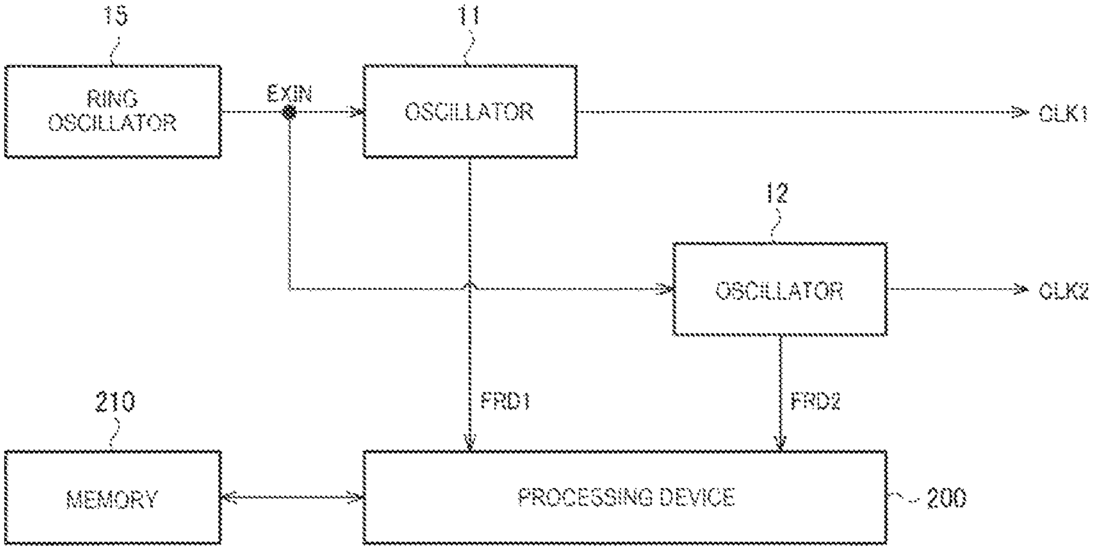
FIG. 23 illustrates a configuration example of a system that performs failure diagnosis or abnormality detection of the oscillator.

A configuration example of a system using the oscillator 10 will be described with reference to FIGS. 21 to 23. In FIGS. 21 to 23, only the internal configuration of the circuit device 100 and the resonator XTAL in the oscillator 10 are illustrated. Also, illustration of terminals is omitted.

FIG. 21 illustrates a configuration example of a frequency synchronization system using the oscillator 10. The system of FIG. 21 includes a reference clock source 18, the oscillator 10, the processing device 200 and the memory 210.

The reference clock source 18 outputs a reference clock signal as the external clock signal EXIN. The reference clock source 18 is, for example, a receiver of a communication system, and a preamble for synchronization and the like included in the reception signal received by the receiver is the reference clock signal. That is, in this system, the reference clock signal such as the preamble for synchronization is temporarily input, and during the period when the reference clock signal is input, the clock signal CLK is frequency-synchronized with the reference clock signal at the same frequency. The communication system can perform communication using the clock signal CLK having the same frequency as the reference clock signal.

Specifically, the processing device 200 includes a multiplier MUX and a register REG. The frequency ratio of the clock signal CLK to the reference clock signal is set in the register REG. An initial value of the frequency ratio set in the register REG is N. N may be any real number greater than 0. The processing device 200 outputs the initial value N stored in the register REG to the oscillator 10 as frequency adjustment data FAD.

The clock signal generation circuit 110 generates the clock signal CLK having a frequency F0×N. The frequency F0 is the frequency of the oscillation clock signal, and the clock signal CLK is generated by multiplying the frequency F0 by N. For example, the clock signal CLK having the frequency F0×N can be generated by a configuration using an oscillation circuit and the fractional-N PLL circuit described later in FIG. 10.

The frequency measurement circuit 190 measures the frequency of the reference clock signal with the frequency F0×N as a reference. When the frequency of the reference clock signal is Fref, the frequency measurement circuit 190 outputs Fref/(F0×N) as the frequency information FRD. The interface circuit 130 outputs the frequency information FRD to the processing device 200.

The multiplier MUX of the processing device 200 multiplies the initial value N stored in the register REG by Fref/(F0×N) which is the frequency information FRD. The multiplier MUX stores Fref/F0, which is the multiplication result, in the register REG as a frequency ratio. The processing device 200 outputs the frequency ratio Fref/F0 stored in the register REG to the oscillator 10 as the frequency adjustment data FAD.

The clock signal generation circuit 110 generates the clock signal CLK by multiplying the oscillation clock signal having the frequency F0 by the frequency ratio Fref/F0. That is, the frequency of the clock signal CLK becomes Fref, and the clock signal CLK frequency-synchronized with the reference clock signal is obtained.

According to the system of FIG. 21, since synchronization processing only needs to be performed once, it is possible to perform frequency synchronization in a short time with the reference clock signal that is temporarily input such as the preamble for synchronization. In this system, since an analog circuit such as the oscillation circuit or the time-to-digital conversion circuit is prepared inside the oscillator 10, only digital processing such as a multiplier and a register needs to be configured outside the oscillator 10. A PLL and the like are required in the synchronization system of the related art, but in the present embodiment, the synchronization system can be configured by using the oscillator 10 and the processing device 200 and storing a program for digital processing performed by the processing device 200 in the memory 160. With this configuration, the synchronization system can be simplified.

FIG. 22 illustrates an example of a system configuration of the FLL using the oscillator 10. The system of FIG. 22 includes the oscillator 10, the processing device 200, and the memory 210.

The external clock signal EXIN is a reference clock signal input from a highly accurate oscillator such as OCXO, or a time pulse input from GNSS or a network. The frequency measurement circuit 190 measures the frequency of the reference clock signal with the frequency of the clock signal CLK as a reference and outputs the frequency information FRD. This frequency measurement is repeatedly performed, and the frequency information FRD indicating the frequencies in time series is output. The interface circuit 130 outputs the frequency information FRD to the processing device 200.

The processing device 200 includes the adder ADDS and the PI processing portion PIS2. The adder ADDS subtracts a set frequency SFR from each frequency of the frequencies in time series input as the frequency information FRD. The PI processing portion PIS2 integrates the output of the adder ADDS. The processing device 200 outputs the output of the PI processing portion PIS2 to the oscillator 10 as the frequency adjustment data FAD.

The clock signal generation circuit 110 adjusts the frequency of the clock signal CLK based on the frequency adjustment data FAD received by the interface circuit 130. With this configuration, the clock signal CLK whose frequency is locked with respect to the reference clock signal is obtained.

According to the system of FIG. 22, the FLL that locks the frequency of the clock signal CLK with respect to the reference clock signal is realized. In this system, since an analog circuit such as an oscillation circuit or a time-to-digital conversion circuit is prepared inside the oscillator 10, only digital processing such as addition processing and PI control needs to be configured outside the oscillator 10. By writing a program in the memory 210, digital processing of various algorithms can be used. That is, it is possible to customize by what algorithm the feedback loop is formed. Alternatively, various additional functions such as speeding up of FLL activation or holdover control can be added.

FIG. 23 illustrates an example of the configuration of a system that performs failure diagnosis or abnormality detection of an oscillator. The system of FIG. 23 includes a ring oscillator 15, oscillators 11 and 12, the processing device 200, and the memory 210.

The ring oscillator 15 generates the external clock signal EXIN. The external clock signal EXIN is a reference clock signal for detecting an abnormality of the oscillators 11 and 12. The oscillator that generates the external clock signal EXIN is not limited to the ring oscillator.

Each of the oscillators 11 and 12 corresponds to the oscillator 10. The oscillator 11 generates a clock signal CLK1. The oscillator 11 measures the frequency of the external clock signal EXIN with the frequency of the clock signal CLK1 as a reference, and outputs frequency information FRD1 to the processing device 200. The oscillator 11 generates the clock signal CLK1. The oscillator 12 measures the frequency of the external clock signal EXIN with the frequency of a clock signal CLK2 as a reference, and outputs frequency information FRD2 to the processing device 200.

The processing device 200 detects an abnormality in the oscillators 11 and 12 based on the frequency information FRD1 and FRD2. The frequency information FRD1 and FRD2 indicate the relative frequencies of the external clock signal EXIN and the clock signals CLK1 and CLK2. When a large variation occurs in either of the two pieces of frequency information FRD1 and FRD2, the processing device 200 can determine that a failure or abnormality has occurred in the oscillator in which the variation has occurred. When a large variation occurs in both of the two pieces of frequency information FRD1 and FRD2, the processing device 200 can determine that a failure or an abnormality has occurred in the entire system. The processing device 200 can detect that the oscillators 11 and 12 are activated by monitoring the frequency information FRD1 and FRD2. The user can customize the failure detection or the abnormality detection of various algorithms by writing the program in the memory 210.

11. Ninth Configuration Example and Tenth Configuration Example

Figure 24:
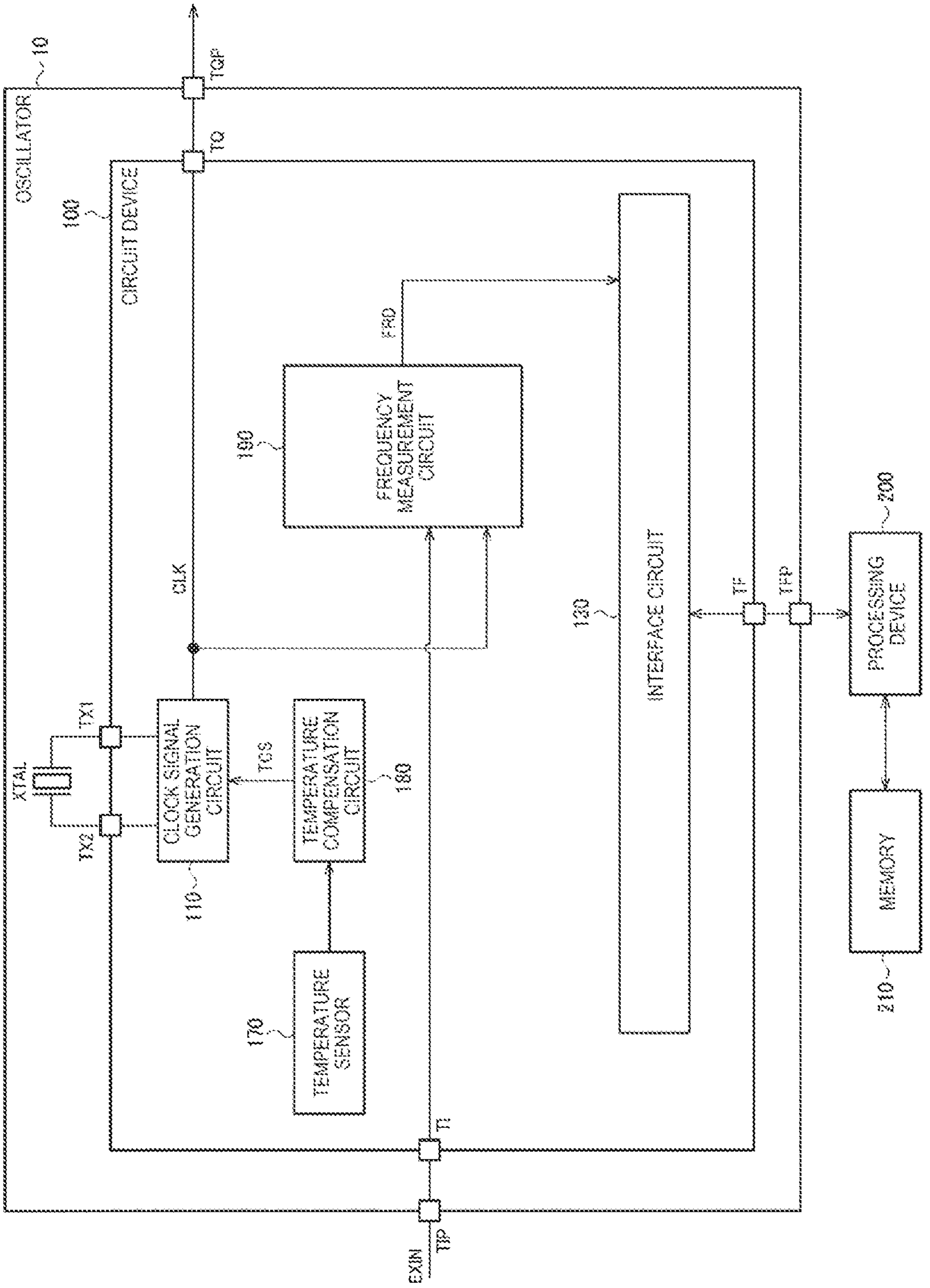
FIG. 24 illustrates a ninth configuration example of the circuit device.

FIG. 24 illustrates a ninth configuration example of the circuit device 100. In the ninth configuration example, the circuit device 100 further includes the temperature sensor 170 and the temperature compensation circuit 180.

First, the case where the temperature compensation circuit 180 generates the digital temperature compensation signal TCS by digital processing will be described. The digital temperature compensation signal TCS is also called temperature compensation data.

The temperature sensor 170 includes a sensor portion and an A/D converter. The sensor portion senses temperature and outputs a temperature detection voltage that depends on the temperature. For example, the sensor portion includes an element having a PN junction and outputs a temperature detection voltage based on a forward voltage of the PN junction. The element having the PN junction is a diode, a bipolar transistor, or the like. The A/D conversion circuit A/D-converts the temperature detection voltage and outputs temperature data obtained by the A/D conversion.

The temperature compensation circuit 180 generates temperature compensation data based on the temperature data. Specifically, the temperature compensation circuit 180 converts the temperature data into temperature compensation data based on a polynomial approximation in which temperature is a variable. The polynomial used for the polynomial approximation is a polynomial that compensates for temperature dependence of the resonator XTAL and the oscillation frequency of the clock signal generation circuit 110.

The clock signal generation circuit 110 adjusts the frequency of the clock signal CLK based on the temperature compensation signal TCS which is the temperature compensation data. Specifically, the clock signal generation circuit 110 generates the clock signal CLK having a frequency according to the temperature compensation data. With this configuration, the clock signal CLK of which the temperature dependence of the frequency is compensated is generated.

As the configuration of the clock signal generation circuit 110, the configuration of FIG. 8 or 9 can be used. When the configuration of FIG. 8 is adopted, temperature compensation data is input to the D/A conversion circuit 112 instead of the frequency adjustment data FAD. With this configuration, the oscillation circuit 111 adjusts the frequency of the clock signal CLK based on the temperature compensation data. When the configuration of FIG. 9 is adopted, the temperature compensation data is input to the frequency division ratio setting circuit FPE instead of the frequency adjustment data FAD. With this configuration, the fractional-N PLL circuit 116 adjusts the frequency of the clock signal CLK by adjusting the frequency division ratio of the feedback loop based on the temperature compensation data.

The seventh or eighth configuration example may be combined with the ninth configuration example in FIG. 24. When the seventh and ninth configuration examples are combined, the circuit device 100 of FIG. 24 further includes the frequency division circuits 141 and 142. When the eighth and ninth configuration examples are combined, the clock signal generation circuit 110 in FIG. 20 further adjusts the frequency of the clock signal CLK based on the frequency adjustment data FAD. For example, temperature compensation data is added to the frequency adjustment data FAD, the added value is input to the clock signal generation circuit 110, and the clock signal generation circuit 110 adjusts the frequency of the clock signal based on the added value. The seventh, eighth, and ninth configuration examples may be combined.

The temperature compensation circuit 180 may generate an analog temperature compensation signal TCS by analog processing. The analog temperature compensation signal TCS is also called a temperature compensation voltage. In this case, the temperature sensor 170 includes a sensor portion and outputs a temperature detection voltage. The temperature compensation circuit 180 includes an analog circuit that performs a polynomial approximation with temperature as a variable, and the analog circuit converts the temperature detection voltage into the temperature compensation voltage. The clock signal generation circuit 110 generates a clock signal CLK having a frequency according to the temperature compensation voltage. With this configuration, the clock signal CLK of which the temperature dependence of the frequency is compensated is generated. As the configuration of the clock signal generation circuit 110, the variable capacitance capacitor CV and the drive circuit 113 of FIG. 8 can be used. That is, the D/A conversion circuit 112 is omitted in FIG. 8, and the temperature compensation voltage is input to one end of the variable capacitance capacitor CV instead of the voltage DAQ.

Figure 25:
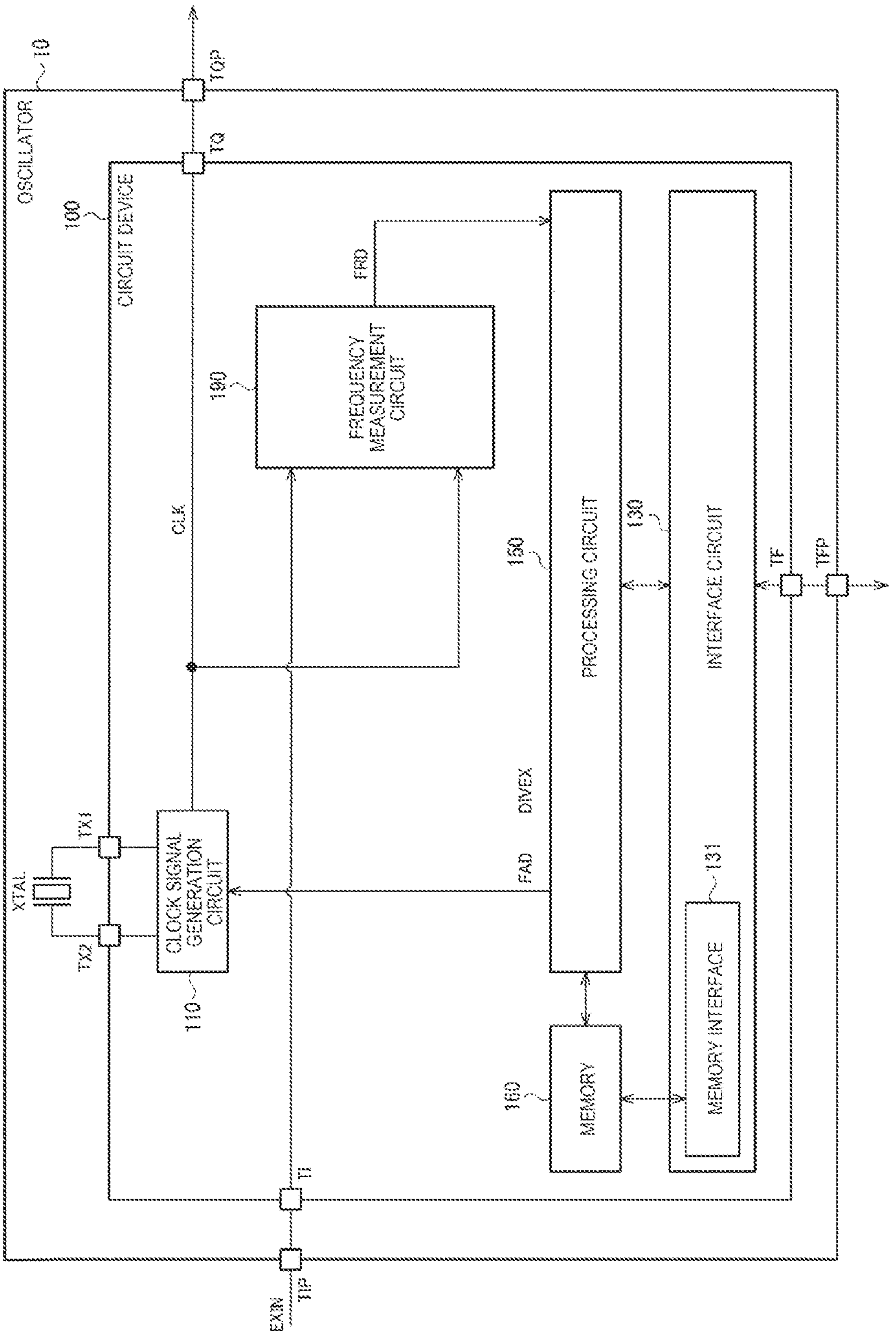
FIG. 25 illustrates a tenth configuration example of the circuit device.

FIG. 25 illustrates a tenth configuration example of the circuit device 100. In the tenth configuration example, the circuit device 100 further includes the processing circuit 150 and the memory 160. The interface circuit 130 also includes the memory interface 131.

The processing circuit 150 included in the circuit device 100 corresponds to the processing device 200 provided outside the oscillator 10. That is, the processing circuit 150 performs signal processing using the frequency information FRD. Specifically, the processing circuit 150 generates the frequency adjustment data FAD according to the frequency information FRD. The clock signal generation circuit 110 adjusts the frequency of the clock signal CLK based on the frequency adjustment data FAD. The method by which the processing circuit 150 generates the frequency adjustment data FAD is as described with reference to FIGS. 20 to 22. The processing circuit 150 is a processor, and the processor is, for example, a microcomputer, a CPU core, or a DSP. The circuit device 100 including the processing circuit 150 is an integrated circuit device. That is, the processing circuit 150 and the memory 160 are provided in one integrated circuit device together with the clock signal generation circuit 110, the frequency measurement circuit 190, and the interface circuit 130.

The memory 160 included in the circuit device 100 corresponds to the memory 210 provided outside the oscillator 10. That is, the memory 160 stores a program in which the procedure of signal processing using the frequency information FRD is described. Specifically, the memory 160 stores a program for the processing circuit 150 to generate the frequency adjustment data FAD based on the frequency information FRD. The processing circuit 150 executes the program stored in the memory 160 to perform signal processing using the frequency information FRD. The processing circuit 150 may output the frequency division ratio setting information DIVEX and DIVG to the frequency division circuits 141 and 142, respectively, by executing the program stored in the memory 160. The memory 160 is a semiconductor memory such as a non-volatile memory or a RAM.

The interface circuit 130 includes the memory interface 131 for accessing the memory 160 from outside the oscillator 10. The memory interface 131 writes the program received by the interface circuit 130 from outside the oscillator 10 in the memory 160. The memory interface 131 may read information stored in the memory 160, and the interface circuit 130 may transmit the information to the outside of the oscillator 10.

According to the present embodiment, the user can write various programs in the memory 160 via the memory interface 131, and various kinds of signal processing using the frequency information FRD can be realized by the programs. An example of signal processing using the frequency information FRD is as described above with reference to FIGS. 21 and 22. By incorporating the processing circuit 150 in the circuit device 100, it is not necessary to provide a processing device for performing signal processing using the frequency information FRD outside the oscillator 10. That is, various kinds of signal processing using the frequency information FRD can be realized by the oscillator 10 alone.

The seventh and tenth configuration examples may be combined. That is, the circuit device 100 of FIG. 25 may further include the frequency division circuits 141 and 142. The ninth and tenth configuration examples may be combined. That is, the circuit device 100 of FIG. 25 may include the temperature sensor 170 and the temperature compensation circuit 180 of FIG. 24. In this case, the temperature compensation circuit 180 may be included in the processing circuit 150. That is, the function of the temperature compensation circuit 180 may be realized as a part of the processing executed by the processing circuit 150.

12. Electronic Apparatus

Figure 26:
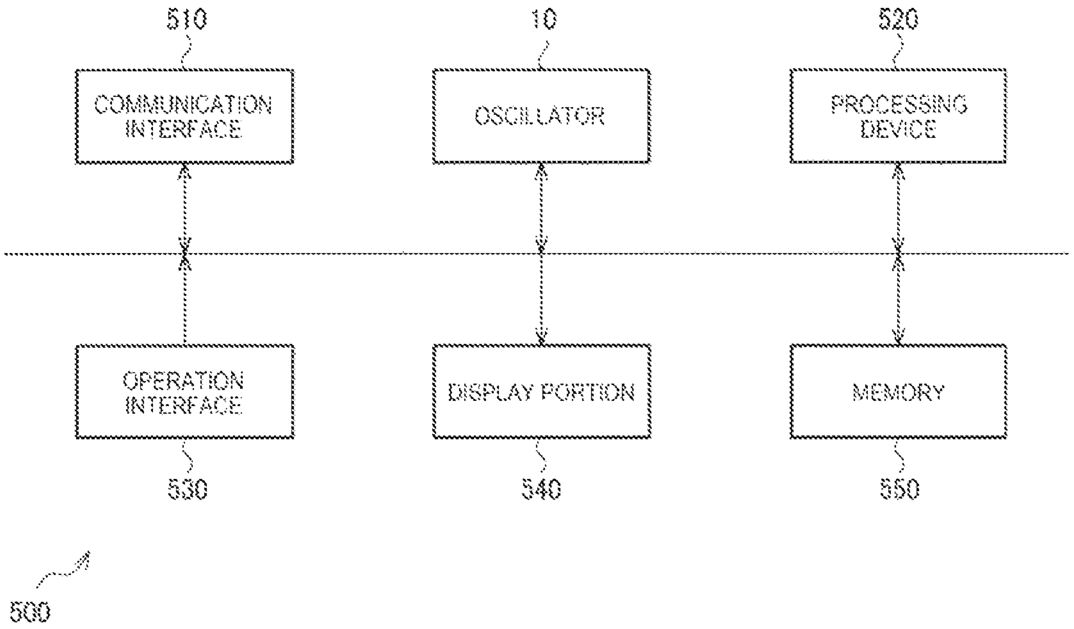
FIG. 26 illustrates a configuration example of an electronic apparatus.

FIG. 26 illustrates a configuration example of an electronic apparatus 500 including the oscillator 10. The electronic apparatus 500 is, for example, a highly accurate measuring device that measures a physical quantity such as a distance, a time, a flow velocity, or a flow rate, a biological information measuring device that measures biological information, an on-vehicle device, a robot, or the like. The biological information measuring device is, for example, an ultrasonic measuring device or the like. The on-vehicle device is a device for automatic driving.

As illustrated in FIG. 26, the electronic apparatus 500 includes the oscillator 10 and a processing device 520 that performs processing based on an output signal from the oscillator 10. The output signal from the oscillator 10 is, for example, the clock signal or time difference information. The processing device 520 may operate based on the clock signal from the oscillator 10, or may perform signal processing using the time difference information from the oscillator 10. The electronic apparatus 500 can also include a communication interface 510, an operation interface 530, a display portion 540, and a memory 550. The electronic apparatus 500 is not limited to the configuration of FIG. 26, and various modifications such as omission of some of these components and addition of other components may be made thereto.

The communication interface 510 performs processing of receiving data from the outside and transmitting data to the outside. The processing device 520, which is a processor, performs control processing of the electronic apparatus 500, various digital processing for data transmitted and received via the communication interface 510, and the like. The functions of the processing device 520 can be realized by a processor such as a microcomputer. The operation interface 530 is for the user to perform an input operation, and can be realized by an operation button, a touch panel display, or the like. The display portion 540 displays various types of information, and can be realized by a display such as a liquid crystal or an organic EL. The memory 550 is for storing data therein, and the function thereof can be realized by a semiconductor memory such as a RAM or ROM.

The oscillator of the present embodiment described as above includes a resonator, a clock signal generation circuit, a clock signal output terminal, an external signal input terminal, an interface circuit, and an interface terminal. The clock signal generation circuit oscillates the resonator to generate a clock signal. The clock signal output terminal outputs the clock signal. An external signal is input to the external signal input terminal. The interface circuit outputs time difference information obtained by measuring a time difference between a transition timing of a first signal based on the external signal input from the external signal input terminal and a transition timing of a second signal based on the clock signal, or frequency information obtained by measuring a frequency of the first clock signal, which is one of the clock signal and the external clock signal, based on a frequency of the second clock signal, which is the other of the clock signal and the external clock signal. The interface terminal is coupled to the interface circuit.

According to the present embodiment, the clock signal generated by the oscillator is output to the outside, and the time difference information or the frequency information is output from the interface circuit via the interface terminal. With this configuration, various kinds of signal processing using the time difference information are realized. For example, an ADPLL, a DLL, a transmission delay measuring device, or the like can be configured by using the oscillator. The oscillator of the present embodiment can be used not only for a specific purpose such as the ADPLL but also for various purposes. Alternatively, various kinds of signal processing using the frequency information are realized. For example, a frequency synchronization system, an FLL, an abnormality detection system or the like can be configured by using the oscillator. The oscillator of the present embodiment can be used not only for a specific purpose such as the FLL but also for various purposes.

The oscillator of the present embodiment includes a resonator, a clock signal generation circuit, a clock signal output terminal, an external signal input terminal, and a time-to-digital conversion circuit. The clock signal generation circuit oscillates the resonator to generate a clock signal. The clock signal output terminal outputs the clock signal. An external signal is input to the external signal input terminal. The time-to-digital conversion circuit measures a time difference between a transition timing of a first signal based on the external signal input from the external signal input terminal and a transition timing of a second signal based on the clock signal and obtains time difference information corresponding to the time difference.

According to the present embodiment, the clock signal generated by the oscillator is output to the outside, and the time difference information indicating the time difference between the transition timing of the clock signal and the transition timing of the external signal input to the oscillator from the outside is obtained. With this configuration, various kinds of signal processing using the time difference information are realized. For example, an ADPLL, a DLL, a transmission delay measuring device, or the like can be configured by using the oscillator. The oscillator of the present embodiment can be used not only for a specific purpose such as the ADPLL but also for various purposes. For example, a processor or the like can be provided outside or inside the oscillator, and by customizing the processing program of the processor, the user can freely customize the function and control algorithm of the system using the oscillator.

The oscillator of the present embodiment includes a resonator, a clock signal generation circuit, a clock signal output terminal, an external signal input terminal, and a frequency measurement circuit. The clock signal generation circuit oscillates the resonator to generate a clock signal. The clock signal output terminal outputs the clock signal. An external clock signal is input to the external signal input terminal. The frequency measurement circuit obtains frequency information corresponding to a frequency of a first clock signal, which is one of the clock signal and the external clock signal, by measuring the frequency of the first clock signal, based on a frequency of a second clock signal, which is the other of the clock signal and the external clock signal.

According to the present embodiment, the clock signal generated by the oscillator is output to the outside, and the frequency information indicating the frequency of the first clock signal, which is one of the clock signal and the external clock signal, is obtained based on the frequency of the second clock signal which is the other of the clock signal and the external clock signal. With this configuration, various kinds of signal processing using the frequency information are realized. For example, a frequency synchronization system, an FLL, an abnormality detection system or the like can be configured by using the oscillator. The oscillator of the present embodiment can be used not only for a specific purpose such as the FLL but also for various purposes. For example, a processor or the like can be provided outside or inside the oscillator, and by customizing the processing program of the processor, the user can freely customize the function and control algorithm of the system using the oscillator.

In the present embodiment, the oscillator may include an interface circuit that outputs the time difference information and an interface terminal coupled to the interface circuit.

According to the present embodiment, the oscillator and the outside thereof are interfaced only with the digital signal such as the external signal, the clock signal, and the time difference information. That is, when a system such as an ADPLL that uses an oscillator is configured, the oscillation circuit and the time-to-digital conversion circuit that are analog parts thereof are configured as a single oscillator, and thus only a digital processing circuit such as a processor may be used outside the oscillator. With this configuration, the user does not need to design the analog part of the system, and thus system development such as a synchronization system can be simplified.

In the present embodiment, the clock signal generation circuit may adjust the frequency of the clock signal based on the frequency adjustment data input via the interface terminal and the interface circuit.

According to the present embodiment, it becomes possible to adjust the frequency of the clock signal output from the oscillator by the frequency adjustment data. For example, by using the frequency adjustment data generated based on the time difference information, the clock signal can be frequency-synchronized or phase-synchronized with the external signal.

In the present embodiment, the clock signal generation circuit may include an oscillation circuit that generates an oscillation clock signal by oscillating the resonator. The oscillation circuit may adjust a frequency of the oscillation clock signal based on the frequency adjustment data and output the oscillation clock signal as the clock signal.

According to the present embodiment, the oscillation frequency of the oscillation circuit is adjusted based on the frequency adjustment data, and the oscillation clock signal is output as the clock signal. With this configuration, the frequency adjustment of the clock signal by the frequency adjustment data is realized.

In the present embodiment, the clock signal generation circuit may include an oscillation circuit that generates an oscillation clock signal by oscillating the resonator, and a fractional-N PLL circuit that receives the oscillation clock signal as a reference clock signal and generates the clock signal. The fractional-N PLL circuit may adjust a frequency division ratio of a feedback loop based on the frequency adjustment data.

According to the present embodiment, the fractional multiplication rate of the fractional-N PLL that generates the clock signal is adjusted based on the frequency adjustment data. With this configuration, the frequency adjustment of the clock signal by the frequency adjustment data is realized.

In the present embodiment, the clock signal generation circuit, the time-to-digital conversion circuit, and the interface circuit may be provided in one semiconductor substrate.

According to the present embodiment, the delay or the waveform deformation of the signal to be measured can be suppressed as compared with the case where the clock signal generation circuit and the time-to-digital conversion circuit are configured as separate ICs, and thus the time-to-digital conversion circuit can measure an accurate time difference.

In the present embodiment, the resonator and the semiconductor substrate may be housed in a package.

In this way, the oscillator including the resonator, the clock signal generation circuit, and the time-to-digital conversion circuit is provided to the user as a packaged oscillator. With this configuration, when a system such as an ADPLL using an oscillator is configured, the oscillation circuit and the time-to-digital conversion circuit, which are the analog parts thereof, are packaged as an oscillator, and thus the user only needs to design digital processing of the system. Since it is not necessary to design the analog part of the system, system development such as a synchronization system can be simplified.

In the present embodiment, the oscillator may include a temperature sensor and a temperature compensation circuit that outputs a temperature compensation signal based on a signal from the temperature sensor. The clock signal generation circuit may adjust the frequency of the clock signal based on the temperature compensation signal.

According to the present embodiment, the frequency of the clock signal is temperature-compensated based on the temperature compensation signal, and thus a frequency deviation of the clock signal due to the temperature change is reduced. With this configuration, time difference information between the transition timing of the external signal and the transition timing of the temperature-compensated and highly accurate clock signal can be obtained.

In the present embodiment, the clock signal generation circuit may include an oscillation circuit that generates an oscillation clock signal by oscillating the resonator. The oscillation circuit may adjust a frequency of the oscillation clock signal based on the temperature compensation signal and output the oscillation clock signal as the clock signal.

According to the present embodiment, the oscillation frequency of the oscillation circuit is adjusted based on the temperature compensation signal, and the oscillation clock signal is output as the clock signal. With this configuration, the frequency adjustment of the clock signal by the temperature compensation signal is realized.

In the present embodiment, the clock signal generation circuit may include an oscillation circuit that generates an oscillation clock signal by oscillating the resonator, and a fractional-N PLL circuit that receives the oscillation clock signal as a reference clock signal and generates the clock signal. The fractional-N PLL circuit may adjust a frequency division ratio of a feedback loop based on the temperature compensation signal.

According to the present embodiment, the fractional multiplication rate of the fractional-N PLL that generates the clock signal is adjusted based on the temperature compensation signal. With this configuration, the frequency adjustment of the clock signal by the temperature compensation signal is realized.

In the present embodiment, the oscillator may include a first frequency division circuit, a second frequency division circuit, and an interface circuit. The interface circuit may receive frequency division ratio setting information for setting a first frequency division ratio that is a frequency division ratio of the first frequency division circuit and a second frequency division ratio that is a frequency division ratio of the second frequency division circuit. The first frequency division circuit may frequency-divides an external clock signal input as the external signal by the first frequency division ratio based on the frequency division ratio setting information and output a first frequency divided clock signal obtained by frequency division. The second frequency division circuit may frequency-divides the clock signal by the second frequency division ratio based on the frequency division ratio setting information and output a second frequency divided clock signal obtained by frequency division. The time-to-digital conversion circuit may measure a phase difference between the first frequency divided clock signal which is the first signal and the second frequency divided clock signal which is the second signal as the time difference.

According to the present embodiment, the cycles of the first signal and the second signal whose transition timings are compared by the time-to-digital conversion circuit can be randomly set by the frequency division ratio setting information. For example, when the cycle of the clock signal or the external clock signal is shorter than the conversion time of the time-to-digital conversion circuit, the conversion time can be secured by the first frequency division circuit or the second frequency division circuit.

In the present embodiment, the time-to-digital conversion circuit may operate based on the clock signal.

According to the present embodiment, the time-to-digital conversion circuit operates based on the clock signal internally generated by the oscillator. For example, the time-to-digital conversion circuit can use a clock signal as a reference clock signal for time measurement.

In the present embodiment, the oscillator may include a processing circuit that generates frequency adjustment data according to the time difference information. The clock signal generation circuit may adjust the frequency of the clock signal based on the frequency adjustment data.

According to the present embodiment, the oscillator can perform various kinds of signal processing using the time difference information. By incorporating the processing circuit in the circuit device, it is not necessary to provide a processing device for performing signal processing using the time difference information outside the oscillator. That is, various kinds of signal processing using the time difference information can be realized by the oscillator alone.

In the present embodiment, the oscillator may include a memory that stores a program for the processing circuit to generate frequency adjustment data.

According to the present embodiment, the processing circuit can execute the signal processing using the time difference information by the program stored in the memory. Since a program describing various kinds of signal processing can be stored in the memory, various kinds of signal processing using the time difference information are realized.

In the present embodiment, the oscillator may include an interface circuit that includes a memory interface for accessing the memory.

In this way, it is possible to store the program describing various kinds of signal processing in the memory via the memory interface. With this configuration, various kinds of signal processing using the time difference information are realized.

An electronic apparatus of the present embodiment includes any of the oscillators described above, and a processing device that performs processing based on an output signal of the oscillator.

Although the present embodiment has been described in detail as described above, it will be easily understood by those skilled in the art that many modifications may be made without departing from novel matters and effects of the present disclosure. Accordingly, all such modification examples are included in the scope of the present disclosure. For example, a term described at least once together with a different term having a broader meaning or the same meaning in the specification or the drawings can be replaced with a different term in any place in the specification or the drawings. All combinations of the present embodiment and modification examples are also included in the scope of the present disclosure. The configurations and operations of the circuit device, the oscillator, the electronic apparatus, and the like are not limited to those described in the present embodiment, and various modifications may be made thereto.

What is claimed is:

1. An oscillator comprising:

a resonator;

a clock signal generation circuit that oscillates the resonator to generate a clock signal;

a clock signal output terminal that outputs the clock signal;

an external signal input terminal that receives an external signal;

an interface circuit that outputs time difference information obtained by measuring a time difference between a transition timing of a first signal based on the external signal input from the external signal input terminal and a transition timing of a second signal based on the clock signal, or frequency information obtained by measuring a frequency of a first clock signal, which is one of the clock signal and the external clock signal, based on a frequency of a second clock signal, which is the other of the clock signal and the external clock signal; and an interface terminal that is coupled to the interface circuit.

2. The oscillator according to claim 1, further comprising:

a time-to-digital conversion circuit that obtains the time difference information.

3. The oscillator according to claim 1, further comprising:

a frequency measurement circuit that obtains the frequency information.

4. The oscillator according to claim 3, wherein the frequency measurement circuit includes, a time-to-digital conversion circuit that measures a time difference between a transition timing of a first signal based on the first clock signal and a transition timing of a second signal based on the second clock signal and outputs time difference information corresponding to the time difference, a counter circuit that performs count processing based on the first clock signal and the second clock signal and outputs count data, and an arithmetic circuit that obtains the frequency information by performing an arithmetic operation based on the time difference information and the count data.

5. The oscillator according to claim 1, wherein the clock signal generation circuit adjusts a frequency of the clock signal based on frequency adjustment data input via the interface terminal and the interface circuit.

6. The oscillator according to claim 5, wherein the clock signal generation circuit includes an oscillation circuit that generates an oscillation clock signal by oscillating the resonator, and the oscillation circuit adjusts a frequency of the oscillation clock signal based on the frequency adjustment data, and outputs the oscillation clock signal as the clock signal.

7. The oscillator according to claim 5, wherein
the clock signal generation circuit includes,
an oscillation circuit that generates an oscillation clock signal by oscillating the resonator, and
a fractional-N PLL circuit that receives the oscillation clock signal as a reference clock signal and generates the clock signal, and
the fractional-N PLL circuit adjusts a frequency division ratio of a feedback loop based on the frequency adjustment data.

8. The oscillator according to claim 2, wherein
the clock signal generation circuit, the time-to-digital conversion circuit, and the interface circuit are provided in one semiconductor substrate.

9. The oscillator according to claim 3, wherein
the clock signal generation circuit, the frequency measurement circuit, and the interface circuit are provided in one semiconductor substrate.

10. The oscillator according to claim 8, wherein
the resonator and the semiconductor substrate are housed in a package.

11. The oscillator according to claim 1, further comprising:
a temperature sensor; and
a temperature compensation circuit that outputs a temperature compensation signal based on a signal from the temperature sensor, wherein
the clock signal generation circuit adjusts a frequency of the clock signal based on the temperature compensation signal.

12. The oscillator according to claim 11, wherein
the clock signal generation circuit includes an oscillation circuit that generates an oscillation clock signal by oscillating the resonator, and
the oscillation circuit adjusts a frequency of the oscillation clock signal based on the temperature compensation signal and outputs the oscillation clock signal as the clock signal.

13. The oscillator according to claim 11, wherein
the clock signal generation circuit includes,
an oscillation circuit that generates an oscillation clock signal by oscillating the resonator, and
a fractional-N PLL circuit that receives the oscillation clock signal as a reference clock signal and generates the clock signal, and
the fractional-N PLL circuit adjusts a frequency division ratio of a feedback loop based on the temperature compensation signal.

14. The oscillator according to claim 2, further comprising:
a first frequency division circuit;
a second frequency division circuit; and
an interface circuit that receives frequency division ratio setting information for setting a first frequency division ratio that is a frequency division ratio of the first frequency division circuit and a second frequency division ratio that is a frequency division ratio of the second frequency division circuit, wherein
the first frequency division circuit frequency-divides an external clock signal input as the external signal by the first frequency division ratio based on the frequency division ratio setting information and outputs a first frequency divided clock signal obtained by frequency division,
the second frequency division circuit frequency-divides the clock signal by the second frequency division ratio based on the frequency division ratio setting information and outputs a second frequency divided clock signal obtained by frequency division, and
the time-to-digital conversion circuit measures a phase difference between the first frequency divided clock signal which is the first signal and the second frequency divided clock signal which is the second signal as the time difference.

15. The oscillator according to claim 3, further comprising:
a first frequency division circuit;
a second frequency division circuit; and
an interface circuit that receives frequency division ratio setting information for setting a first frequency division ratio that is the frequency division ratio of the first frequency division circuit and a second frequency division ratio that is the frequency division ratio of the second frequency division circuit, wherein
the first frequency division circuit frequency-divides the first clock signal by the first frequency division ratio based on the frequency division ratio setting information and outputs a first frequency divided clock signal obtained by frequency division,
the second frequency division circuit frequency-divides the second clock signal by the second frequency division ratio based on the frequency division ratio setting information and outputs a second frequency divided clock signal obtained by frequency division, and
the frequency measurement circuit obtains the frequency information by measuring a frequency of the first frequency divided clock signal based on a frequency of the second frequency divided clock signal.

16. The oscillator according to claim 2, wherein
the time-to-digital conversion circuit operates based on the clock signal.

17. The oscillator according to claim 1, further comprising:
a processing circuit that generates frequency adjustment data according to the time difference information or the frequency information, wherein
the clock signal generation circuit adjusts a frequency of the clock signal based on the frequency adjustment data.

18. The oscillator according to claim 17, further comprising:
a memory that stores a program for causing the processing circuit to generate the frequency adjustment data.

19. The oscillator according to claim 18, further comprising:
an interface circuit that includes a memory interface for accessing the memory.

20. An electronic apparatus comprising:
the oscillator according to claim 1; and
a processing device that performs processing based on an output signal of the oscillator.

* * * * *